US012603619B2

(12) United States Patent
Kang et al.

(10) Patent No.: US 12,603,619 B2
(45) Date of Patent: Apr. 14, 2026

(54) LOW NOISE AMPLIFIER AND APPARATUS INCLUDING THE SAME

(71) Applicant: Samsung Electronics Co., Ltd., Suwon-si (KR)

(72) Inventors: Byoung Joong Kang, Incheon (KR); Hyung Sun Lim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 512 days.

(21) Appl. No.: 18/150,625

(22) Filed: Jan. 5, 2023

(65) Prior Publication Data

US 2023/0223905 A1 Jul. 13, 2023

(30) Foreign Application Priority Data

Jan. 10, 2022 (KR) ......................... 10-2022-0003469

(51) Int. Cl.
| | |
|---|---|
| *H03F 3/193* | (2006.01) |
| *H03F 1/22* | (2006.01) |
| *H03F 1/56* | (2006.01) |

(52) U.S. Cl.
CPC .............. *H03F 3/193* (2013.01); *H03F 1/226* (2013.01); *H03F 1/565* (2013.01); *H03F 2200/222* (2013.01); *H03F 2200/294* (2013.01)

(58) Field of Classification Search
CPC .......... H03F 3/193; H03F 3/195; H03F 3/211; H03F 3/72; H03F 3/68; H03F 3/19; H03F 3/602; H03F 1/226; H03F 1/565; H03F 1/0277; H03F 1/223; H03F 1/26; H03F 2200/222; H03F 2200/294;
(Continued)

(56) References Cited

U.S. PATENT DOCUMENTS

| | | | |
|---|---|---|---|
| 8,903,343 | B2 | 12/2014 | Holenstein et al. |
| 9,154,356 | B2 | 10/2015 | Tasic et al. |

(Continued)

FOREIGN PATENT DOCUMENTS

KR      10-2018-0070328  A      6/2018

OTHER PUBLICATIONS

Coilcraft.com "Basics of Inductor Selection (from Electronic Design magazine)" (Year: 2025).*

(Continued)

*Primary Examiner* — Andrea Lindgren Baltzell
*Assistant Examiner* — Nareh Shamiryan
(74) *Attorney, Agent, or Firm* — Fish & Richardson P.C.

(57) ABSTRACT

A low noise amplifier includes a first input port configured to receive a first input signal, a second input port configured to receive a second input signal, and a first amplifier stage including a first gain stage connected to the first input port and the second input port, and a first drive stage between the first gain stage and a first load circuit. The first gain stage includes a first-first gain block connected to the first input port, a first-second gain block connected to the second input port, and a first degeneration inductor between a ground terminal and a first common node of the first-first gain block and the first-second gain block. The amplifier includes a second amplifier stage including a second gain stage connected to the first input port and the second input port, and a second drive stage between the second gain stage and a second load.

18 Claims, 15 Drawing Sheets

(58) Field of Classification Search
  CPC ......... H03F 2200/378; H03F 2200/541; H03F
          2200/301; H03F 2200/42; H03G 3/20
  USPC ........ 330/278, 311, 283, 301, 252–261, 295,
                          330/124 R
  See application file for complete search history.

(56)                    References Cited

U.S. PATENT DOCUMENTS

|  |  |  |
|---|---|---|
| 9,154,357 B2 | 10/2015 | Tasic et al. |
| 9,774,303 B1 | 9/2017 | Ayranci et al. |
| 9,917,614 B1 | 3/2018 | Kang |
| 9,973,149 B2 | 5/2018 | Ayranci et al. |
| 11,005,425 B2 | 5/2021 | Ayranci et al. |
| 2013/0043946 A1 | 2/2013 | Hadjichristos et al. |
| 2013/0315348 A1 | 11/2013 | Tasic et al. |
| 2018/0062582 A1 | 3/2018 | Pehlivanoglu |
| 2021/0058044 A1 | 2/2021 | Ayranci et al. |

OTHER PUBLICATIONS

Office Action in Korean Appln. No. 10-2022-0003469, mailed on
Dec. 30, 2025, 14 pages (with English translation).

* cited by examiner (a)                   (b)

(a)                   (b)

(a)                            (b)

LOW NOISE AMPLIFIER AND APPARATUS INCLUDING THE SAME

CROSS-REFERENCE TO RELATED APPLICATION

This application claims priority from Korean Patent Application No. 10-2022-0003469 filed on Jan. 10, 2022 in the Korean Intellectual Property Office, and all the benefits accruing therefrom under 35 U.S.C. 119, the contents of which in its entirety are herein incorporated by reference.

BACKGROUND

Some example embodiments of the inventive concepts relate to a low noise amplifier and an apparatus including the same.

Carrier aggregation may refer to the use of a plurality of carriers together in transmission to one wireless communication device or in transmission from one wireless communication device. A frequency domain transmitted by one carrier may be referred to as a frequency channel, and an amount of data transmitted through wireless channels may be increased due to carrier aggregation supporting a plurality of frequency channels. In the carrier aggregation, frequency channels through which data is transmitted may be variously arranged, and a transmitter, receiver, or transceiver of a wireless communication device may be used to support various arrangements of such frequency channels.

SUMMARY

Some aspects of the inventive concepts may provide a low noise amplifier which may be implemented in a smaller area to efficiently support variously arranged frequency channels, an apparatus including the same, and a method of amplifying a signal.

However, aspects of the inventive concepts are not restricted to those set forth herein. The above and other aspects of the inventive concepts may become more apparent by referencing the detailed description of some example embodiments given below.

According to an aspect of the inventive concepts, a low noise amplifier includes a first input port configured to receive a first input signal, a second input port configured to receive a second input signal, and a first amplifier stage including a first gain stage connected to the first input port and the second input port, and a first drive stage connected between the first gain stage and a first load circuit. The first gain stage includes a first-first gain block connected to the first input port, a first-second gain block connected to the second input port, and a first degeneration inductor connected between a ground terminal and a first common node of the first-first gain block and the first-second gain block. The amplifier includes a second amplifier stage including a second gain stage connected to the first input port and the second input port, and a second drive stage connected between the second gain stage and a second load circuit.

According to another aspect of the inventive concepts, a low noise amplifier includes a first amplifier stage including a first drive stage and a first gain stage. The first gain stage includes a first-first gain block connected to a first input port and a first-second gain block connected to a second input port. The first drive stage is configured to receive an amplified first input signal from the first gain stage and transmit the received input signal to at least one of a first load circuit and a second load circuit. The amplifier includes a second amplifier stage including a second gain stage comprising a second gain block connected to the first input port and a second drive stage connected between the second gain stage and a second load circuit.

According to another aspect of the inventive concepts, a low noise amplifier includes a first load circuit, a second load circuit, a third load circuit, and a first amplifier stage including a first gain stage configured to amplify a first input signal of a first input port or a second input signal of a second input port, a first-first drive stage configured to transmit an output of the first gain stage to the first load circuit, a first-second drive stage configured to transmit the output of the first gain stage to the second load circuit, and a first-third drive stage configured to transmit the output of the first gain stage to the third load circuit. The amplifier includes a second amplifier stage including a second gain stage configured to amplify the second input signal of the second input port, and a second drive stage configured to transmit an output of the second gain stage to the second load circuit. The amplifier includes a third amplifier stage including a third gain stage configured to amplify the second input signal of the second input port, and a third drive stage configured to transmit an output of the third gain stage to the third load circuit. In a non-contiguous intra-band carrier aggregation mode, when the first input port or the second input port is enabled, at least two or more of the first to third amplifier stages are simultaneously enabled.

It should be noted that example effects of the inventive concepts are not limited to those described above, and other example effects of the inventive concepts may be apparent from the following description.

BRIEF DESCRIPTION OF THE DRAWINGS

The above and other aspects and features of the inventive concepts may become more apparent by describing in detail some example embodiments thereof with reference to the attached drawings, in which.

DETAILED DESCRIPTION OF SOME EXAMPLE EMBODIMENTS

Hereinafter, some example embodiments of the present disclosure will be described with reference to the attached drawings.

Hereinafter, a low noise amplifier according to some example embodiments of the inventive concepts will be described with reference to FIGS. 1 to 20.

Figure 1:
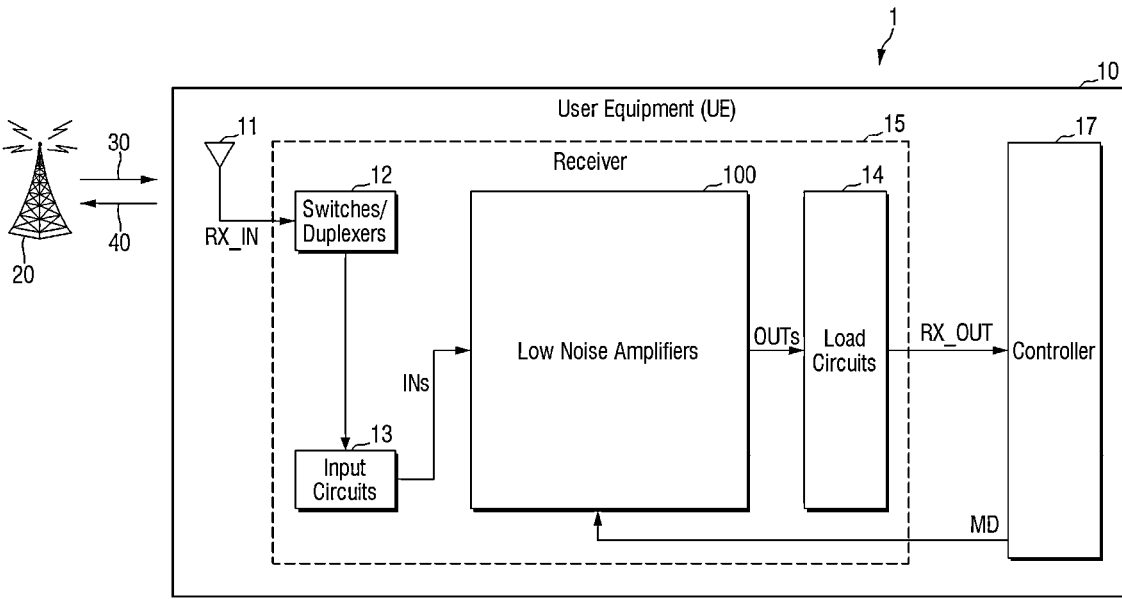
FIG. 1 is a block diagram illustrating a wireless communication system 1 including a user equipment (UE) 10 and a base station (BS) 20 according to an example embodiment of the inventive concepts.

FIG. 1 is a block diagram illustrating a wireless communication system 1 including a user equipment (UE) 10 and a base station (BS) 20 according to an example embodiment of the inventive concepts. As shown in FIG. 1, the UE 10 and the BS 20 may communicate with each other through a downlink (DL) 30 and an uplink (UL) 40.

The wireless communication system 1 may be a Long-Term Evolution (LTE) system, a code division multiple access (CDMA) system, a Global System for Mobile Communications (GSM) system, a wireless local area network (WLAN) system, or another wireless communication system, as non-limiting examples. The UE 10, which is a wireless communication device, may be fixed or may be moved, and may refer to various devices which may communicate with the BS 20 to transmit and receive data and/or control information. For example, the UE 10 may be referred to as a terminal equipment, a mobile station (MS), a mobile terminal (MT), a user terminal (UT), a subscribe station (SS), a wireless device, a handheld device, or the like, but example embodiments are not limited thereto. The BS 20 may generally refer to a fixed station which communicates with the UE and/or another BS, and may exchange data and control information by communicating with the UE and/or another BS. For example, the BS 20 may be referred to as a node B, an evolved-Node B (eNB), a base transceiver system (BTS), an access point (AP), or the like.

The wireless communication network between the UE 10 and the BS 20 may support communication of multiple users by sharing available network resources. For example, in a wireless communication network, information may be transferred in various methods such as CDMA, frequency division multiple access (FDMA), time division multiple access (TDMA), orthogonal frequency division multiple access (OFDMA), single carrier frequency division multiple access (SC-FDMA), and the like, but example embodiments are not limited thereto.

The wireless communication system 1 may support carrier aggregation using a plurality of carriers. That is, the UE 10 and the BS 20 may transmit and/or receive data using a plurality of carriers simultaneously or substantially simultaneously. Carriers used by the UE 10 and the BS 20 in carrier aggregation may be referred to as component carriers, and a frequency domain transmitted by one component carrier may be referred to as a frequency channel. A frequency channel may be included in a frequency band, and the frequency band may include a plurality of contiguous frequency channels. For example, in LTE, a width of a frequency channel covered by one component carrier may be 20 MHz, and one frequency band may cover up to 200 MHz, but other example embodiments may use other frequency values or ranges. As described below with reference to FIGS. 2A to 2C, frequency channels used by the UE 10 and the BS 20 may be variously arranged.

The UE 10 (or the BS 20) may include a structure for appropriately processing signals received through various frequency channels. For example, the UE 10 may include a receiver 15 for separating the frequency channels from each other. Also, the receiver may also support transmission not using carrier aggregation, that is, processing of signals including one carrier. Referring to FIG. 1, the UE 10 may include an antenna 11, the receiver 15, and a controller 17. Also, according to some example embodiments, the UE 10 may further include a transceiver configured to transmit a signal using the antenna 11.

The antenna 11 may provide a receiver input signal RX_IN by receiving a signal, which may be transmitted by the BS 20 and includes at least one carrier. The receiver 15 may provide a receiver output signal RX_OUT from the receiver input signal RX_IN provided from the antenna 11. For example, the receiver 15 may provide a receiver output signal RX_OUT including at least one signal in a baseband from the receiver input signal RX_IN received through the plurality of frequency channels.

The controller 17 may detect data transmitted by the BS 20 by processing the receiver output signal RX_OUT, for example, by performing sampling, demodulation, decoding, and the like. Also, the controller 17 may set a mode of the receiver 15 according to a preset type of carrier aggregation. For example, carriers used by the BS 20 to transmit signals may be preset, and the controller 17 may generate a mode signal MD based on the set carriers.

The mode (or an operation mode) of the receiver 15 may be determined according to the mode signal MD provided by the controller 17. That is, the receiver 15 may provide the receiver output signal RX_OUT by processing the receiver input signal RX_IN differently according to the mode signal MD. As illustrated in FIG. 1, the receiver 15 may include switches/duplexers 12, input circuits 13, low noise amplifiers (LNAs) 100, and load circuits 14.

Figure 20:
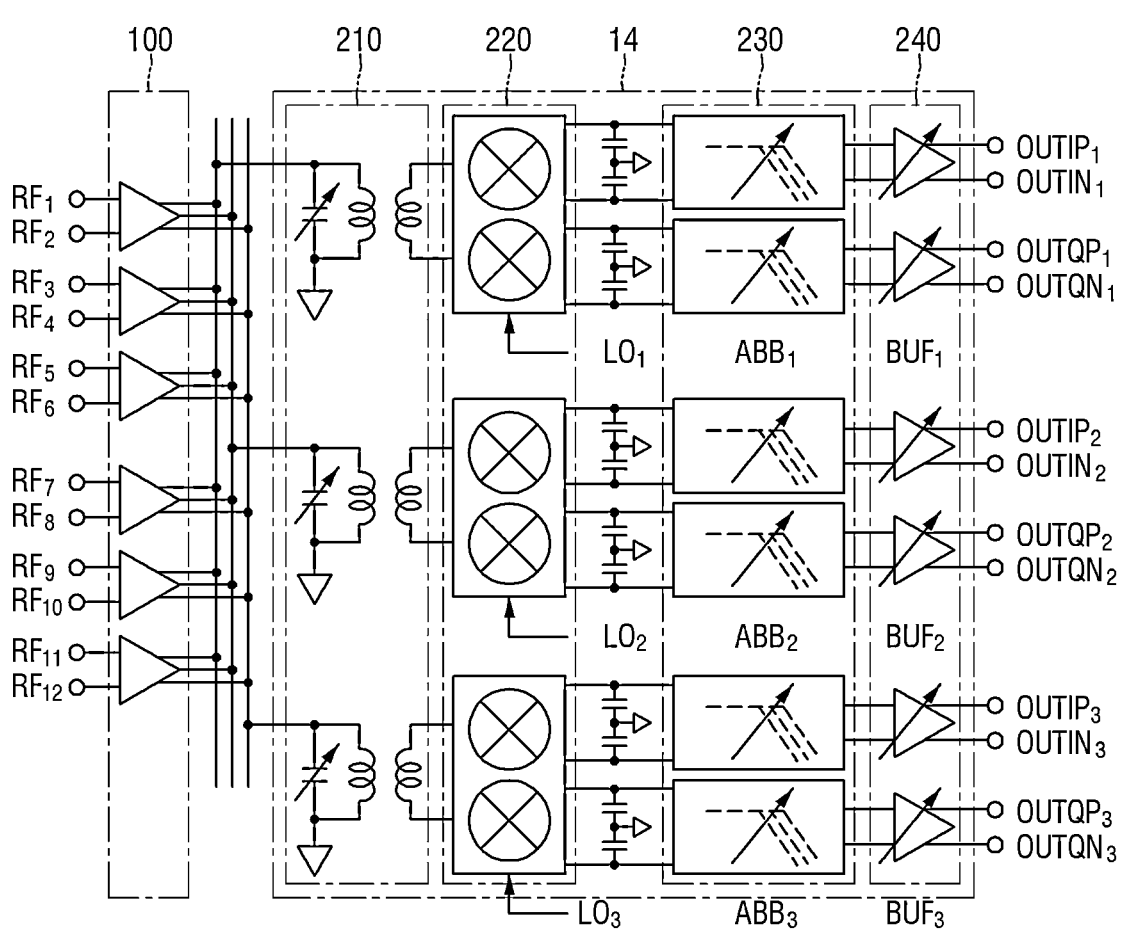
FIG. 20 is a view illustrating an example of a receiver including an LNA according to some example embodiments.

The switches/duplexers 12 may route the receiver input signal RX_IN to provide to the input circuits 13. The input circuits 13 may include matching circuits which perform power and/or impedance matching between the antenna 11 or the switches/duplexers 12 and the LNAs 100, and may provide input signals INs. According to some example embodiments, as illustrated in FIG. 20 or 21, the input signals INs may be provided through a plurality of lines.

The LNAs 100 may provide output signals OUTs by amplifying the input signals INs. The output signals OUTs output from the LNAs 100 by amplifying the input signals INs may be related to carriers. For example, signals included in the output signals OUTs may correspond to carriers, that is, frequency channels, respectively. Accordingly, as described below, the load circuits 14 may include mixers, the mixers may down-convert each of the signals included in the output signals OUTs based on the carriers, and the load circuits 14 may provide the receiver output signal RX_OUT including a plurality of baseband signals. As described above, the carriers included in the input signals INs (or the receiver input signal RX_IN) may be variously set, and the LNAs 100 may provide the output signals OUTs according to the setting of the carriers.

As described above, the LNA 100 according to some example embodiments may have a structure in which amplification paths of the input signals INs are changed according to the setting of the carriers (or the arrangement of the frequency channels), and thus the frequency channels may be efficiently separated despite the variation of the arrangement of the frequency channels. Hereinafter, it will be appreciated that while example embodiments of the present disclosure may be described with reference to the UE 10, some example embodiments are also applicable to the BS 20 which receives the signals from the UE 10 through the plurality of frequency channels. Also, according to example embodiments of the inventive concepts, the LNAs 100 may be included in a single package as semiconductor devices, the LNAs 100 and the load circuits 14 may be included in a single package as semiconductor devices, a transceiver including a receiver may be included in a single package as a semiconductor device, etc.

Figure 2A:
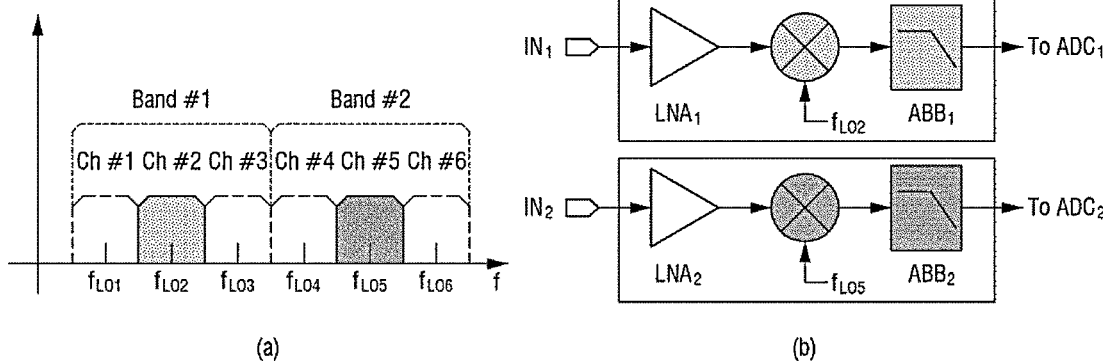
FIGS. 2A, 2B and 2C are views illustrating example types of carrier aggregation and example structures for extracting signals from frequency channels corresponding to the types of carrier aggregation.
Figure 2B:
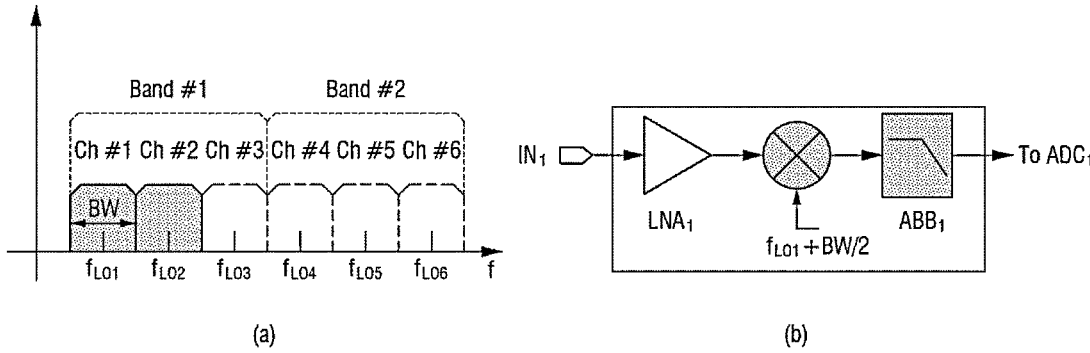
Figure 2C:
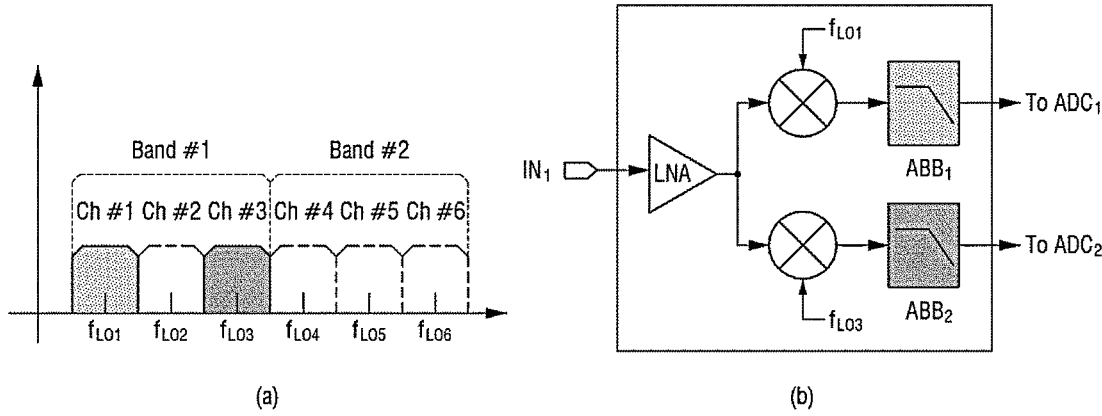

FIGS. 2A to 2C are views illustrating example types of carrier aggregation and example structures for extracting signals from frequency channels corresponding to the types of carrier aggregation. Specifically, FIG. 2A illustrates inter-band carrier aggregation, FIG. 2B illustrates contiguous intra-band carrier aggregation, and FIG. 2C illustrates non-contiguous intra-band carrier aggregation. In the examples of FIGS. 2A to 2C, two bands BAND #1 and BAND #2 may be used for transmission of signals, and one band may have three frequency channels (or three carriers).

Referring to FIG. 1, and FIGS. 2A to 2C, an LNA 100 included in the LNAs 100 may output a signal, which is obtained by amplifying a signal received through one line, through at least one line. For example, the LNA 100 may output a first output signal OUT1 or second output signal OUT2 by amplifying a first input signal IN1 included in the input signals INs based on the setting of the carriers. For example, the signal output from the LNA 100 may be determined based on the mode signal MD received from the controller 17 (see FIG. 1).

Referring to FIG. 2A, in inter-band carrier aggregation, frequency channels in use may be arranged in different bands, respectively. For example, as illustrated in FIG. 2A, frequency channels CH #2 and CH #5 in use may be included in the first and second bands BAND #1 and BAND #2, respectively, and thus may be relatively far apart from each other. Two noise amplifiers LNA1 and LNA2 may output first and second output signals OUT1 and OUT2 to a mixer by amplifying first and second input signals IN1 and IN2, respectively, and the first and second output signals OUT1 and OUT2 may be down-converted in the mixer, that is, converted into baseband signals, by frequencies $f_{LO2}$ and $f_{LO5}$ corresponding to the frequency channels CH #2 and CH #5, respectively.

Referring to FIG. 2B, in contiguous intra-band carrier aggregation, frequency channels in use may be continuously arranged in the same band. For example, as illustrated in FIG. 2B, frequency channels CH #1 and CH #2 in use may be included in a first band BAND #1, and may be adjacent to each other. An LNA1 may output a first output signal OUT1 by amplifying a first input signal IN1, and the first output signal OUT1 may be down-converted by an intermediate frequency (e.g., $(f_{LO1}+f_{LO2})/2$, $(f_{LO1}+BW/2)$, etc.)

of frequencies $f_{LO1}$ and $f_{LO2}$ of carriers corresponding to the frequency channels CH #1 and CH #2 in use, respectively.

Referring to FIG. 2C, in non-contiguous intra-band carrier aggregation, frequency channels in use may be discretely arranged (or be spaced) in the same band. For example, as illustrated in FIG. 2C, frequency channels CH #1 and CH #3 in use may be included in a first band BAND1, and may be spaced apart from each other. The frequency channels CH #1 and CH #3 in use in the non-contiguous intra-band carrier aggregation may be arranged relatively adjacent to each other as compared to those in the inter-band carrier aggregation of FIG. 2A, whereas the frequency channels CH #1 and CH #3 may be arranged over a wide frequency range as compared to those in the contiguous intra-band carrier aggregation of FIG. 2B.

As an example for separating the frequency channels CH #1 and CH #3 in use in the non-contiguous intra-band carrier aggregation, as illustrated in FIG. 2C, an LNA may output two output signals, that is, first and second output signals OUT1 and OUT2, from a first input signal IN1, and the first and second output signals OUT1 and OUT2 may be down-converted by frequencies $f_{LO1}$ and $f_{LO3}$ corresponding to the frequency channels CH #1 and CH #3, respectively. In this case, the LNA may generate one output signal by amplifying one input signal as illustrated in FIGS. 2A and 2B or may generate two output signals by amplifying one input signal IN1 as illustrated in FIG. 2C in order to support different types of carrier aggregation.

In a low cost narrow band application in which the receiver 15 alone may secure sensitivity without the help of an external LNA, a cascode LNA including a source degeneration inductor may be used in order to facilitate or secure low power and excellent narrow band in the receiver 15. The source degeneration inductor which is a passive element may have a much larger size than other active elements and thus may occupy a significant area in the LNA. The size of the inductor may tend to become larger as the frequency decreases.

Since the source degeneration inductor may affect the gain of the LNAs, it may not be shared by two or more LNAs that simultaneously or substantially simultaneously operate. For example, when two or more LNAs operating simultaneously or substantially simultaneously share a source degeneration inductor, more DC and AC currents may flow compared to the case of using one LNA for the source degeneration inductor, and hence gate-source voltage applied to a transistor of a gain stage may decrease, which may further deteriorate the gain of the LNAs.

For this reason, the LNA which may have the same number of paths as the number of carrier components and supports the non-contiguous intra-band carrier aggregation may have a source degeneration inductor individually allocated for each path, and accordingly, the area of the LNA may rapidly increase. In order to reduce the area of the LNAs, attempts to reduce the number of inductors by sharing a source degeneration inductor between two or more LNAs having different input signals are being made.

Figure 3:
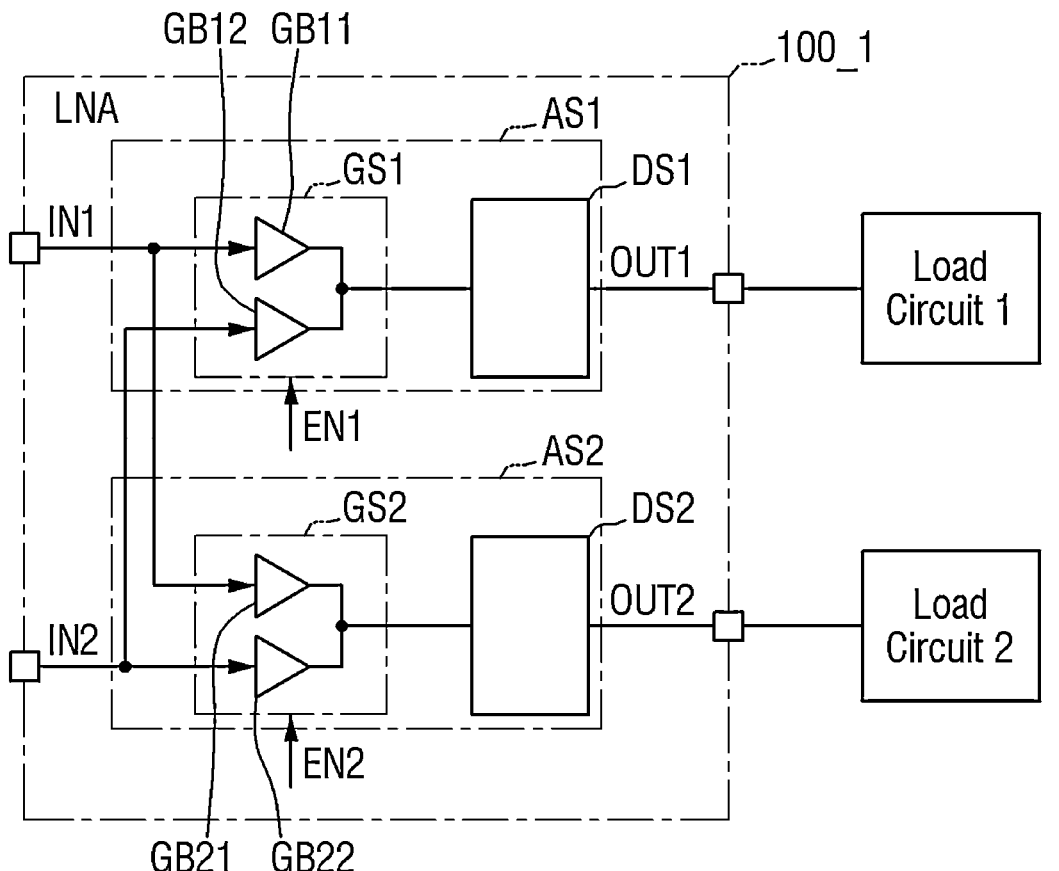
FIG. 3 is a block diagram illustrating an example of an LNA according to some embodiments.
Figure 4:
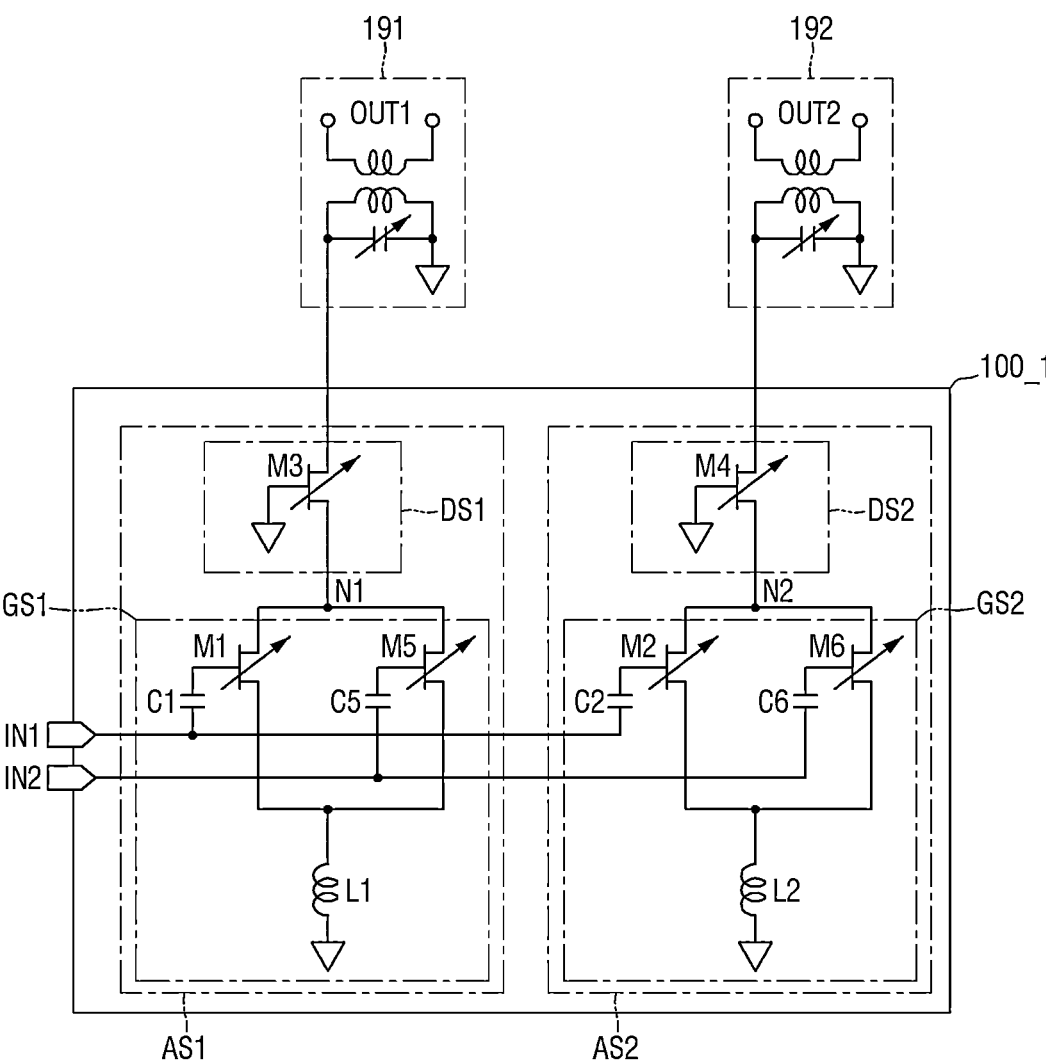
FIG. 4 is a circuit diagram illustrating an example embodiment of the LNA of FIG. 3.

FIG. 3 is a block diagram illustrating an example of an LNA according to some example embodiments, and FIG. 4 is a circuit diagram illustrating an example embodiment of the LNA of FIG. 3. The LNA of FIGS. 3 and 4 is an example embodiment described based on aggregation of two carriers for convenience of description, and it should be noted that example embodiments are not limited thereto.

The LNA 100 may include a first amplifier stage AS1 and a second amplifier stage AS2 as shown in FIG. 3.

The first amplifier stage AS1 may receive a first input signal IN1 and may be enabled or disabled based on a mode signal MD. The enabled first amplifier stage AS1 may output a first output signal OUT1 by amplifying the first input signal IN1. The second amplifier stage AS2 may receive a first input signal IN1 and may be enabled or disabled based on a mode signal MD. The enabled second amplifier stage AS2 may output second and third output signals OUT2 and OUT3 by amplifying the first input signal IN1.

The first and second amplifier stages AS1 and AS2 may be selectively enabled. For example, based on the mode signal MD received from the controller 17, the first amplifier stage AS1 may be enabled and the second amplifier stage AS2 may be enabled in a first mode. Accordingly, the first input signal IN1 may be amplified by the first amplifier stage AS1 or the second amplifier stage AS2. As will be described with reference to FIGS. 5A and 5B, the first and second amplifier stages AS1 and AS2 may be designed such that a difference between an input impedance of the LNA 100 in the first mode and an input impedance of the LNA 100 in a second mode is reduced. Accordingly, variation of the input imped- ance of the LNA 100 may be reduced, and variation of an attenuation ratio of the first input signal IN1 according to the variation of the input impedance may also be reduced. As a result, since the first and second amplifier stages AS1 and AS2 may not have a change of gain caused by the variation of the input impedance, the first and second amplifier stages AS1 and AS2 may have good characteristics (e.g., linearity and bandwidth).

Specifically, referring to FIG. 3, an LNA 100-1 according to some example embodiments may include two input ports IN1 and IN2, two gain stages GS1 and GS2, two drive stages DS1 and DS2, and two output ports OUT1 and OUT2.

The LNA 100-1 may enable at least one gain stage GS1 or GS2 based on enable signals EN1 and EN2. The enable signals EN1 and EN2 may be based on the mode signal MD of FIG. 1. The first gain stage GS1 and the second gain stage GS2 may receive input signals from the input ports IN1 and IN2, respectively.

Referring to FIGS. 3 and 4, the first amplifier stage AS1 includes a first gain stage GS1 and a first drive stage DS1. The first gain stage GS1 includes a first gain block and a second gain block that are connected to the first input port IN1 and the second input port IN2, respectively. Outputs of the first gain block and the second gain block are respec- tively input to the first drive stage DS1 and the first drive stage DS1 drives the received outputs of the gain blocks and outputs a first output signal OUT1.

The first gain stage GS1 may include input capacitors C1 and C5, input transistors M1 and M5, and a degeneration inductor L1, and the first drive stage DS1 may include a cascode transistor M3. The input capacitor C1 may be connected between the first input port IN1 and a gate terminal of the input transistor M1, and the degeneration inductor L1 may be connected between common nodes of the input transistors M1 and M5, e.g., a source terminal and a ground terminal of the input transistors M1 and M5. The input capacitor C5 may be connected between the second input port IN2 and a gate terminal of the input transistor M5.

The drive stage DS1 may include a cascode transistor M3, and the cascode transistor M3 may be connected between the drain terminal N1 of the input transistors M1 and M5 and the first output port OUT1.

The cascode transistor M3 may adjust a gain of the first amplifier stage AS1 by providing a bias to the input tran- sistors M1 and M5 and simultaneously or substantially simultaneously varying the cascode transistor M3. That is, the first amplifier stage AS1 may adjust a ratio of the first input signal IN1 to the first output signal OUT1 or a ratio of the second input signal IN2 to the first output signal OUT1 according to the varying of the cascode transistor M3.

The second gain stage GS2 may include input capacitors C2 and C6, input transistors M2 and M6, and a degeneration inductor L2, and the second drive stage DS2 may include a cascode transistor M4. The input capacitor C2 may be connected between the first input port IN1 and the input transistor M2, and the degeneration inductor L2 may be connected between a source terminal and a ground terminal of the input transistors M2 and M6. The input capacitor C6 may be connected between the second input port IN2 and a gate terminal of the input transistor M6.

The drive stage DS2 may include the cascode transistor M4, and the cascode transistor M4 may be connected between a common drain terminal of the input transistors M2 and M6 and the second output port OUT2. The cascode transistor M4 may adjust a gain of the second amplifier stage AS2 by providing a bias to the input transistors M2 and M6 and simultaneously or substantially simultaneously varying the cascode transistor M4. That is, the second amplifier stage AS2 may adjust a ratio of the first input signal IN1 to the first output signal OUT1 or a ratio of the second input signal IN2 to the first output signal OUT1 according to the varying of the cascode transistor M4.

According to some example embodiments, the cascode transistors M3 and M4 shown in FIG. 4 may be indepen- dently varied to independently control the gains of the first amplifier stage AS1 and the second amplifier stage AS2. According to some example embodiments, a desired (or, alternatively predetermined) bias may be applied to a gate terminal of each of the cascode transistors M3 and M4 shown in FIG. 4.

Load circuits 191 and 192 may each be connected to the LNA 100-1. The first amplifier stage AS1 may be connected to a first load circuit 191 to transmit a first output signal, and the second amplifier stage AS2 may be connected to a second load circuit 192 to transmit a second output signal.

That is, the LNA 100-1 may include a number of gain blocks GB corresponding to the number of input signal terminals IN, and the gain blocks may be merged into one output terminal and applied to an input of the drive stage DS. Although the drive stage DS includes one input terminal and one output terminal, a number of gain blocks corresponding to the number of input signal terminals IN may be enabled according to an enable signal, and thus the input signals of the enabled gain blocks may be transmitted to the load circuit. Detailed operations will be described with reference to FIGS. 5A to 7B.

Figure 5A:
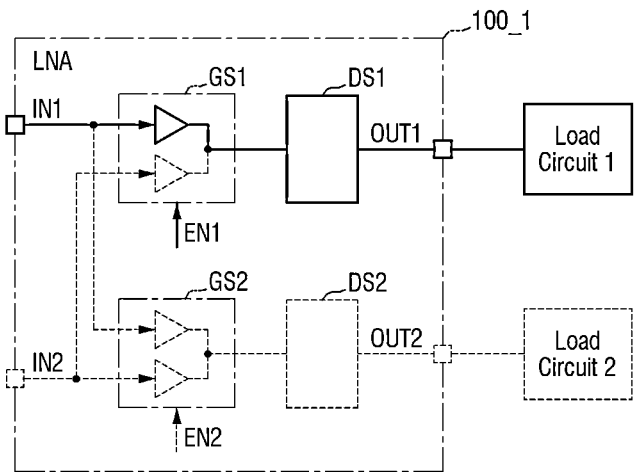
FIGS. 5A, 5B, 5C and 5D are views illustrating a first operation mode of an LNA according to some example embodiments.
Figure 5B:
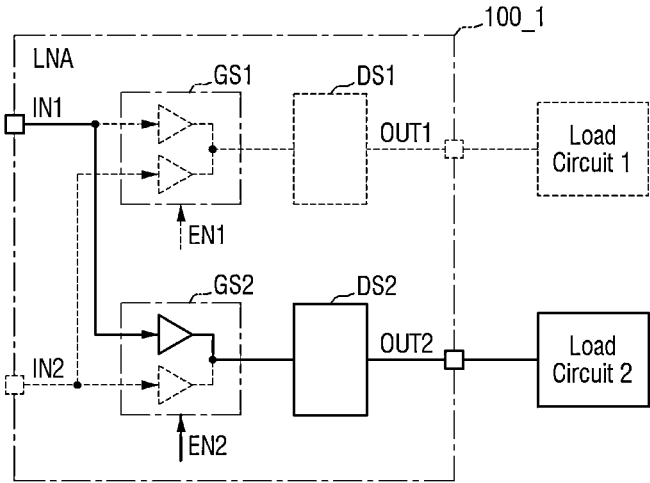
Figure 5C:
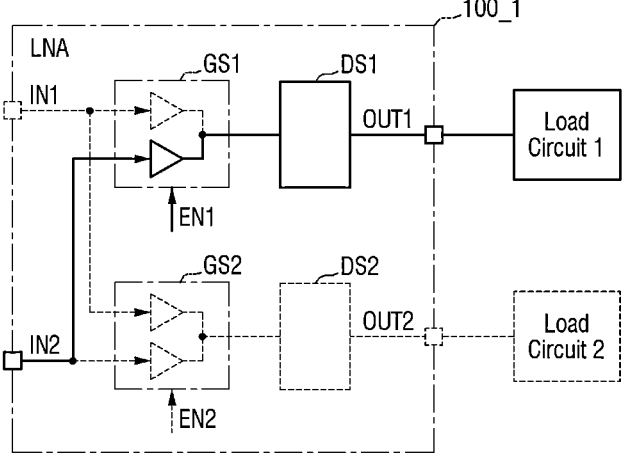
Figure 5D:
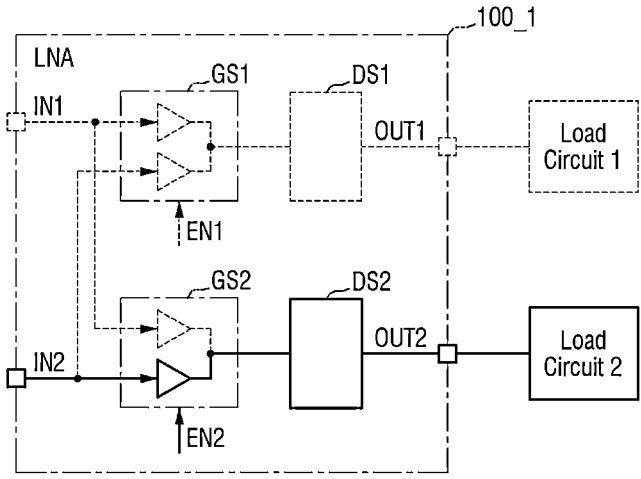
Figure 6A:
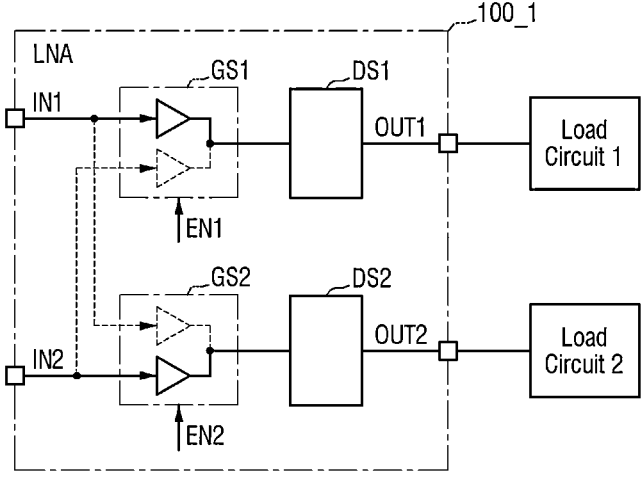
FIGS. 6A and 6B are views illustrating a second operation mode of an LNA according to some embodiments.
Figure 6B:
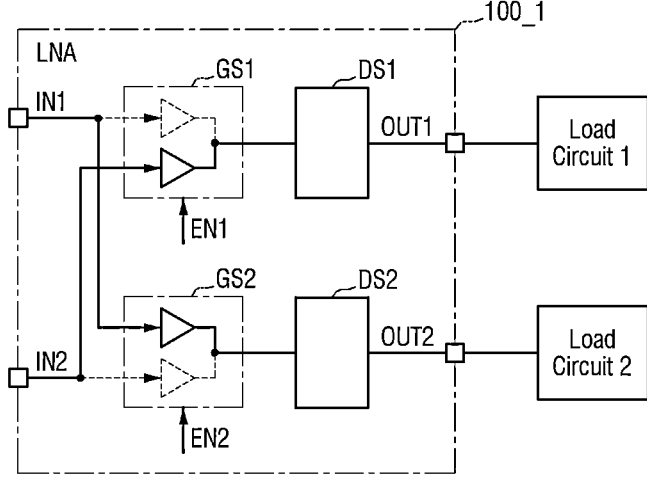
Figure 7A:
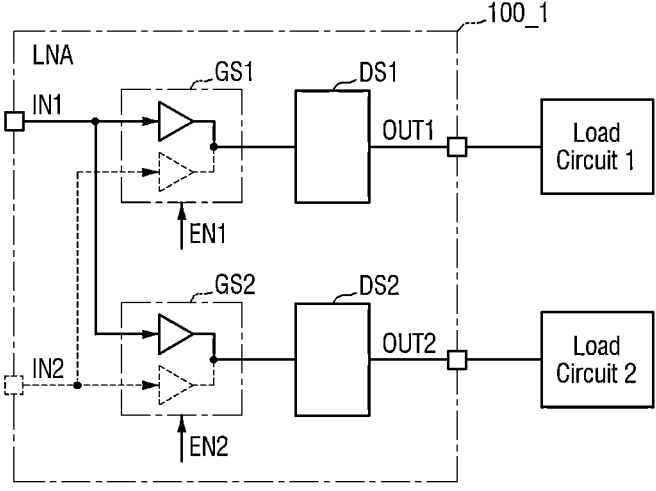
FIGS. 7A and 7B are views illustrating a third operation mode of the LNA according to some example embodiments.
Figure 7B:
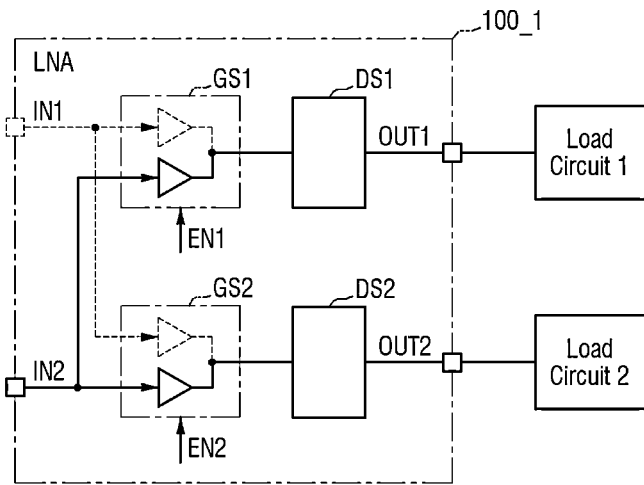

FIGS. 5A to 7B are views of an LNA 100-1 having the same structure, illustrating operation states of the LNA according to an operation mode, and elements and lines that are enabled in relation to the amplification of an input signal are denoted by solid lines and disabled elements and lines are denoted by dotted lines. FIGS. 5A to 5D illustrate an operation mode in non-carrier aggregation. In connection with the operation of the LNA 100-1 of FIGS. 5A to 5D, when the LAN 100-1 operates with other LNAs according to some example embodiments, it may operate in an inter-band carrier aggregation mode. In the following description, only a case in which signals are applied to two or more input terminals in the LNA will be defined as inter-band carrier aggregation. FIGS. 6A to 6B illustrate an operation mode in inter-band carrier aggregation. FIGS. 7A to 7B illustrate an operation mode in non-contiguous intra-band carrier aggre- gation.

FIGS. 5A to 5D are views illustrating a first operation mode of an LNA according to some example embodiments.

According to some example embodiments, in a non-carrier aggregation mode (FIG. 2A), the mode signal MD activates only one of the enable signals EN1 and EN2. In order to enable one gain stage, the first enable signal EN1 may have a logic value different from that of the second enable signal EN2. In order to enable the first gain stage and disable the second gain stage, for example, the first enable signal EN1 may be logic high and the second enable signal EN2 may be logic low (EN1=high, EN2=low). In another example, the first enable signal EN1 may be logic low and the second enable signal EN2 may be logic high (EN1=low, EN2=high).

Referring to FIG. 5A, shown is an example in which, when the first input signal is received, the first gain stage GS1 is enabled according to the first enable signal EN1 and the second gain stage GS2 is disabled according to the second enable signal EN2. When the first input signal IN1 is received, the first gain stage GS1 transmits the first input signal to the first drive stage DS1 through a gain block GB11 connected to an input port. The first drive stage DS1 amplifies the first input signal according to a bias and outputs a first output signal OUT1 based on the first input signal to a first load circuit (Load Circuit 1) connected to the first output port.

Referring to FIG. 5B, shown is an example in which, when a first input signal is received, the first gain stage GS1 is disabled according to the first enable signal EN1 and the second gain stage GS2 is enabled according to the second enable signal EN2. When the first input signal IN1 is received, the second gain stage GS2 transmits the first input signal to the second drive stage DS2 through a gain block GB21 connected to an input port. The second drive stage DS2 amplifies the first input signal according to a bias and outputs a second output signal OUT2 based on the first input signal to a second load circuit (Load Circuit 2) connected to the second output port.

Referring to FIG. 5C, an example will be described in which, when a second input signal is received, the first gain stage GS1 is enabled according to the first enable signal EN1 and the second gain stage GS2 is disabled according to the second enable signal EN2. When the second input signal IN2 is received, the first gain stage GS1 transmits the second input signal to the first drive stage DS1 through a gain block GB12 connected to the input port. The first drive stage DS1 amplifies the second input signal according to a bias and outputs a first output signal OUT1 based on the second input signal to the first load circuit (Load Circuit 1) connected to the first output port.

Referring to FIG. 5D, shown is an example in which, when a second input signal is received, the first gain stage GS1 is disabled according to the first enable signal EN1 and the second gain stage GS2 is enabled according to the second enable signal EN2. When the second input signal IN2 is received, the second gain stage GS2 transmits the second input signal to the second drive stage DS2 through a gain block GB22 connected to the input port. The second drive stage DS2 amplifies the second input signal according to a bias and outputs a second output signal OUT2 based on the second input signal to the second load circuit (Load Circuit 2) connected to the second output port.

FIGS. 6A and 6B are views illustrating a second operation mode of an LNA according to some example embodiments. According to some embodiments, in an inter-band carrier aggregation mode (see FIG. 2A), different signals IN1 and IN2 are respectively transmitted to all input ports as shown in FIGS. 6A and 6B, and the input signals are each amplified through different paths and transmitted to different load circuits.

Referring to FIGS. 6A and 6B, the first gain stage GS1 is enabled according to a first enable signal EN1 and the second gain stage GS2 is enabled according to a second enable signal EN2. In this case, in a first channel of the LNA 100-1, a first input signal is applied to the first gain stage GS1 and a second input signal is applied to the second gain stage (see FIG. 6A), while in a second channel of the LNA 100-1, as opposed to the inputs in the first channel, a second input signal is applied to the first gain stage GS1 and the first input signal is applied to the second gain stage (see FIG. 6B). At this time, the paths of each gain stage used in the first channel and the second channel may be paths passing different gain blocks GB.

Specifically, referring to FIG. 6A, the first input signal is applied to the gain block GB11 of the first gain stage GS1 through the first input port and the gain block GB11 transmits the first input signal to the first drive stage DS1. The first drive stage DS1 amplifies the transmitted first input signal to output a first output signal OUT1. In this case, the gain block GB12 is disabled. The second input signal is applied to the gain block GB22 of the second gain stage GS2 through the second input port and the gain block GB22 transmits the second input signal to the second drive stage DS2. The second drive stage DS2 amplifies the transmitted second input signal to output a second output signal OUT2. In this case, the gain block GB21 is disabled.

Referring to FIG. 6B, the first input signal is applied to the gain block GB21 of the second gain stage GS2 through the first input port and the gain block GB21 transmits the first input signal to the second drive stage DS2. The second drive stage DS2 amplifies the transmitted second input signal to output a second output signal OUT2. In this case, the gain block GB22 is disabled. The second input signal is applied to the gain block GB12 of the first gain stage GS1 through the second input port and the gain block GB12 transmits the second input signal to the first drive stage DS1. The first drive stage DS1 amplifies the transmitted second input signal to output a first output signal OUT1. In this case, the gain block GB11 is disabled.

FIGS. 7A to 7B are views illustrating a third operation mode of the LNA according to some example embodiments. According to some example embodiments, in a non-contiguous intra-band carrier aggregation mode (see FIG. 2C), a signal is input to one of input signal terminals IN1 or IN2 as shown in FIGS. 7A and 7B, and one of the input signals is amplified at each amplifier stage and transmitted to all load circuits.

Referring to FIGS. 7A and 7B, the first gain stage GS1 is enabled according to a first enable signal EN1 and the second gain stage GS2 is enabled according to a second enable signal EN2. In this case, in a first channel of the LNA 100-1, a first input signal is applied to the first gain stage GS1 and the second gain stage GS2 (see FIG. 7A), while in a second channel of the LNA 100-1, a second input signal is applied to the first gain stage GS1 and the second gain stage GS2. At this time, the paths of each gain stage used in the first channel and the second channel may be paths passing different gain blocks GB.

Specifically, referring to FIG. 7A, the first input signal is applied to the gain block GB11 of the first gain stage GS1 and the gain block GB21 of the second gain stage GS2 through the first input port IN1. The gain block GB11 transmits the first input signal to the first drive stage DS1 and the gain block GB21 transmits the first input signal to the second drive stage DS2. The drive stages DS1 and DS2 amplify the transmitted first input signal to output a first output signal OUT1 and a second output signal OUT2, respectively. In this case, the gain blocks GB12 and GB22 are disabled.

Referring to FIG. 7B, the second input signal is applied to the gain block GB12 of the first gain stage GS1 and the gain block GB22 of the second gain stage GS2 through the second input port IN2. The gain block GB12 transmits the second input signal to the first drive stage DS1 and the gain block GB22 transmits the second input signal to the second drive stage DS2. The drive stages DS1 and DS2 amplify the transmitted second input signal to output a first output signal OUT1 and a second output signal OUT2, respectively. In this case, the gain blocks GB11 and GB21 are disabled.

Figure 8:
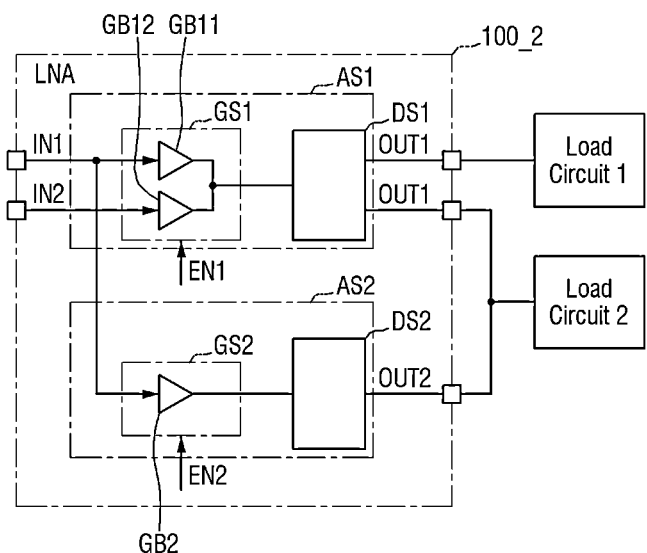
FIG. 8 is a block diagram illustrating an example of an LNA according to some example embodiments.
Figure 9:
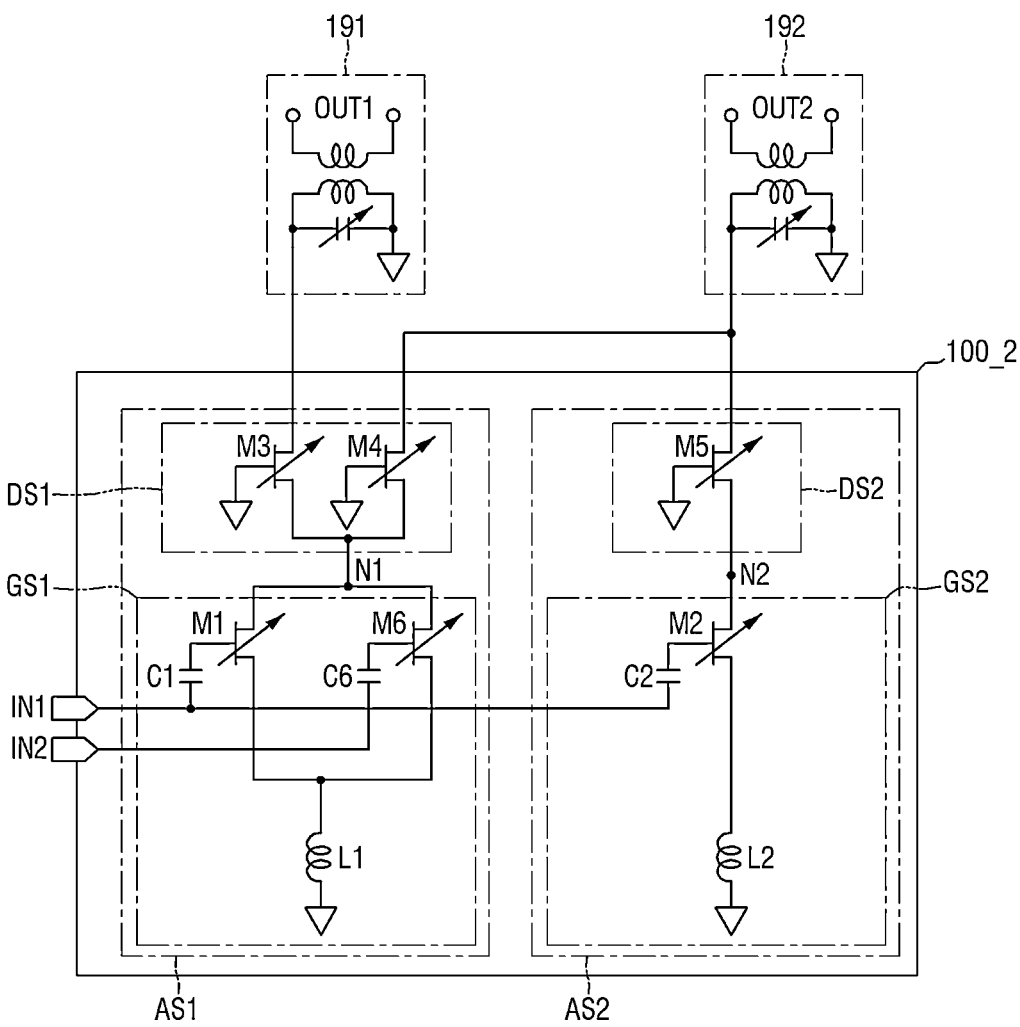
FIG. 9 is a circuit diagram illustrating an example embodiment of the LNA of FIG. 8.

FIG. 8 is a block diagram illustrating an example of an LNA according to some example embodiments, and FIG. 9 is a circuit diagram illustrating an example embodiment of the LNA of FIG. 8. For simplicity, description redundant to FIGS. 3 and 4 will be omitted.

Referring to FIGS. 8 and 9, an LNA 100-2 according to some example embodiments may include two input ports IN1 and IN2, two gain stages GS1 and GS2, two drive stages DS1 and DS2, and two output ports OUT1 and OUT2. The LNA 100-1 may enable at least one gain stage GS1 or GS2 based on enable signals EN1 and EN2.

A first amplifier stage AS1 includes the first gain stage GS1 and the first drive stage DS1, and a second amplifier stage AS2 includes the second gain stage GS2 and the second drive stage DS2.

The first gain stage GS1 includes a first gain block GB11 and a second gain block GB12 that are connected to the first input port IN1 and the second input port IN2, respectively. Outputs of the first gain block GB11 and the second gain block GB12 are respectively input to the first drive stage DS1 and the first drive stage DS1 drives the received outputs of the gain blocks to a first output port OUT1. The first output port OUT1 is connected to each of a first load circuit (Load Circuit 1) and a second load circuit (Load Circuit 2).

The second amplifier stage AS1 is connected between the first input port IN1 and a second output port OUT2. The second gain stage GS2 includes one gain block GB2 connected only to the first input port IN1. The second drive stage DS2 drives the first input signal amplified in the gain block GB2 to the second output port OUT2 and outputs it to the second load circuit (Load circuit 2).

The first gain stage GS1 may include input capacitors C1 and C6, input transistors M1 and M6, and a degeneration inductor L1, and the first drive stage DS1 may include cascode transistors M3 and M4. The input capacitor C1 is connected between the first input port IN1 and the input transistor M1, and the degeneration inductor L1 is connected between the second input port IN2 and the input transistor M6. The degeneration inductor L1 may be connected between a source terminal and a ground terminal of the input transistors M1 and M6. The cascode transistor M3 may be connected between a common drain terminal (e.g., a first node N1) of the input transistors M1 and M6 and a first output port OUT1-191 connected to a first load circuit 191. The cascode transistor M4 may be connected between the first node N1 and a first output port OUT1-192 connected to a second load circuit 192.

The cascode transistors M3 and M4 may adjust a gain of the first amplifier stage AS1 by providing a bias to the input transistors M1 and M6 and simultaneously or substantially simultaneously varying the cascode transistors M3 and M4. That is, the first amplifier stage AS1 may adjust a ratio of the first input signal IN1 to the first output signal OUT1-191 or a ratio of the second input signal IN2 to the first output signal OUT1-191 according to the bias control of the cascode transistor M3. Also, the first amplifier stage AS1 may adjust a ratio of the first input signal IN1 to the first output signal OUT1-192 or a ratio of the second input signal IN2 to the first output signal OUT1-192 according to the varying of the cascode transistor M4.

The second gain stage GS2 may include an input capacitor C2, an input transistor M2, and a degeneration inductor L2, and the second drive stage DS2 may include a cascode transistor M5. The input capacitor C2 may be connected between the first input port IN1 and the input transistor M2, and the degeneration inductor L2 may be connected between a source terminal and a ground terminal of the input transistor M2. The cascode transistor M5 may be connected between a drain terminal N2 of the input transistor M2 and a second output port OUT2 connected to the second load circuit 192.

The cascode transistor M5 may adjust a gain of the second amplifier stage AS2 by providing a bias to the input transistor M2 and simultaneously varying the cascode transistor M5. That is, the second amplifier stage AS2 may adjust a ratio of the first input signal IN1 to the second output signal OUT2 according to the varying of the cascode transistor M5.

According to some example embodiments, the cascode transistors M3, M4, and M5 shown in FIG. 9 may be independently varied to independently control the gains of the first amplifier stage AS1 and the second amplifier stage AS2. According to some example embodiments, a desired (or, alternatively predetermined) bias may be applied to a gate terminal of each of the cascode transistors M3, M4, and M5 shown in FIG. 9.

Load circuits 191 and 192 may each be connected to the LNA 100-2. The first amplifier stage AS1 may be connected to the first load circuit 191 and the second load circuit 192 to transmit the first output signal, and the second amplifier stage AS2 may be connected to the second load circuit 192 to transmit the second output signal.

That is, in the LNA 100-2 according to some example embodiments, the first gain stage GS1 is disposed to support various carrier aggregation modes including non-contiguous intra-band carrier aggregation, and the second input port IN2 supporting the non-carrier aggregation mode and the inter-band carrier aggregation mode includes one gain block, such that the second gain stage GS2 having the output port connected to only one gain block may be disposed. The first gain stage GS1 may be connected to all load circuits in order to support the inter-band carrier aggregation, select a switch according to the first input signal or second input signal received from the input port, and output an output signal to a selected load circuit.

Figure 10A:
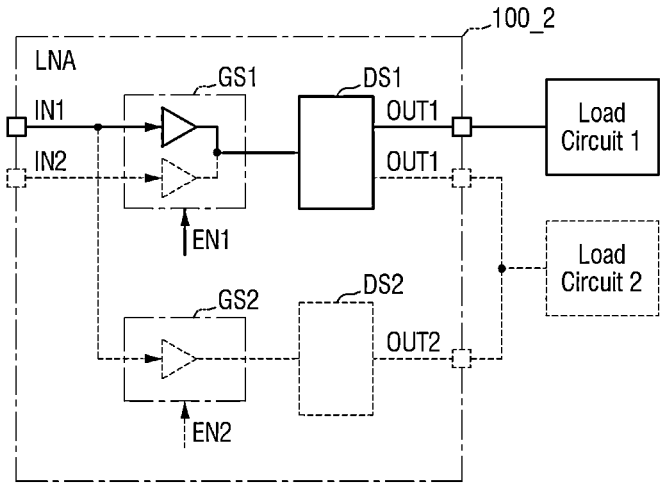
FIGS. 10A, 10B, 10C and 10D illustrate an operation mode in non-carrier aggregation.
Figure 10B:
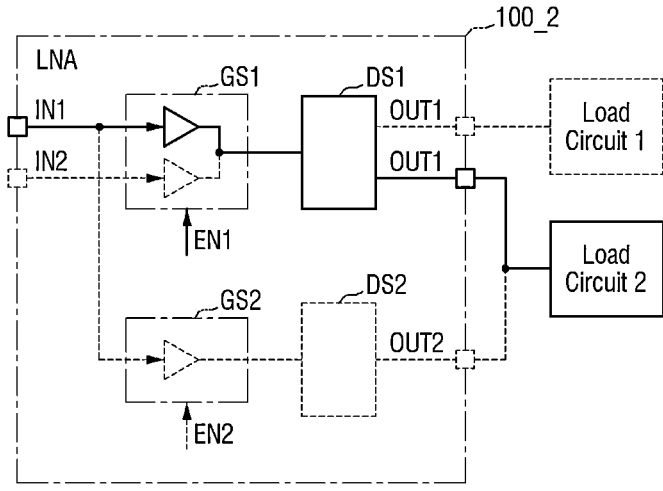
Figure 10C:
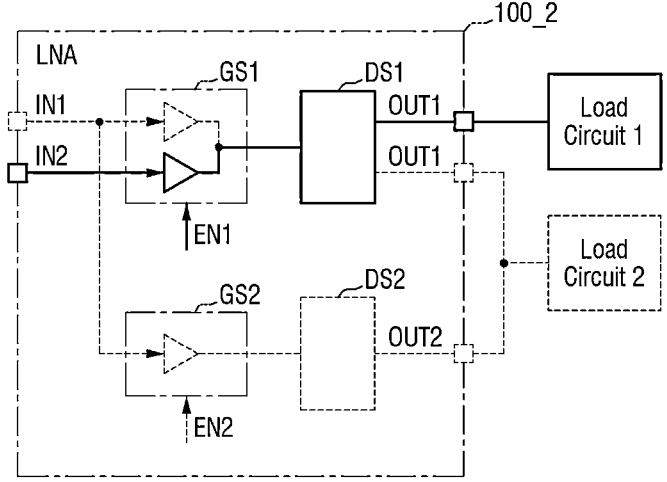
Figure 10D:
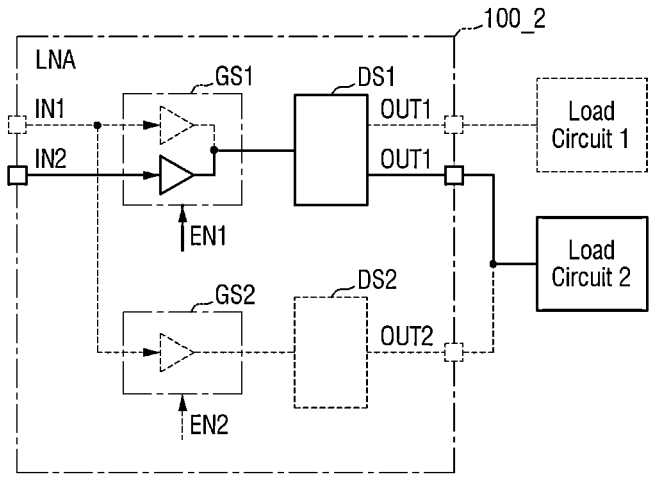
Figure 11:
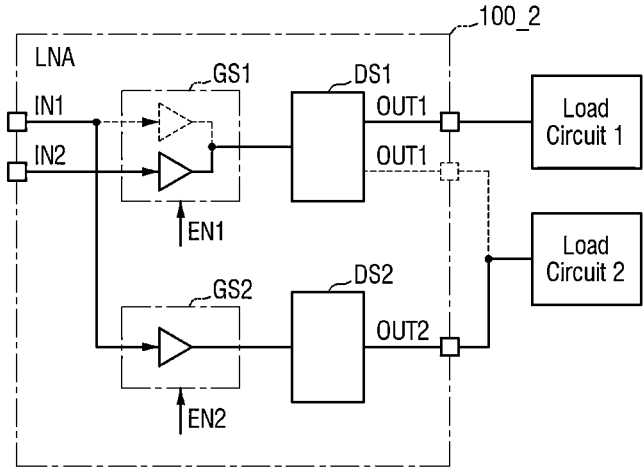
FIG. 11 illustrates an operation mode in inter-band carrier aggregation.
Figure 12:
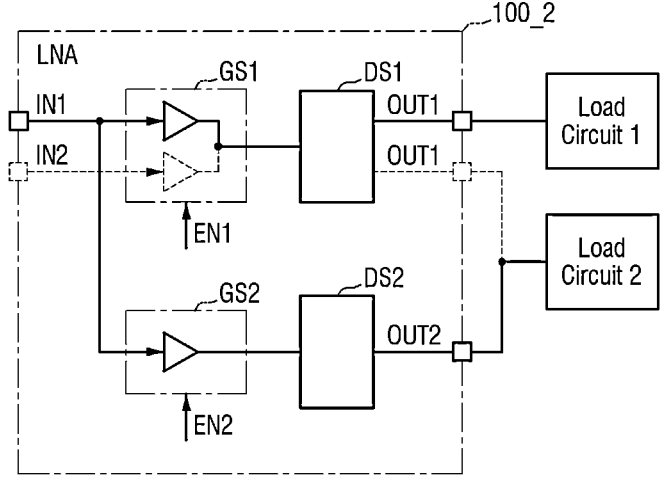
FIG. 12 illustrates an operation mode in non-contiguous intra-band carrier aggregation.

FIGS. 10A to 12 are views of an LNA 100-2 having the same structure, illustrating operation states of the LNA according to an operation mode, wherein elements and lines that are enabled in relation to the amplification of an input signal are denoted by solid lines and disabled elements and lines are denoted by dotted lines. FIGS. 10A to 10D illustrate an operation mode in non-carrier aggregation. FIG. 11 illustrates an operation mode in inter-band carrier aggregation. FIG. 12 illustrates an operation mode in non-contiguous intra-band carrier aggregation.

FIGS. 10A to 10D are views illustrating a first operation mode of an LNA according to some example embodiments.

According to some example embodiments, in a non-carrier aggregation mode (FIG. 2A), the mode signal MD activates only one of the enable signals EN1 and EN2. In order to enable one gain stage, the first enable signal EN1 may have a logic value different from that of the second enable signal EN2.

Referring to FIGS. 10A and 10B, shown are an example in which, when a first input signal is received, only a first gain block GB of a first gain stage GS1 is enabled and a second gain block GB12 is disabled according to the first enable signal EN1 and a second gain stage GS2 is disabled according to the second enable signal EN2.

In FIG. 10A, when the first input signal IN1 is received, the first gain stage GS1 transmits the first input signal to the first drive stage DS1 through a gain block GB11 connected to an input port. The first drive stage DS1 amplifies the first input signal and outputs an output signal based on the first input signal to a first load circuit (Load Circuit 1) connected to a first output port OUT1.

Referring to FIG. 10B, when the first input signal IN1 is received, the first gain stage GS1 transmits the first input signal to the first drive stage DS1 through the gain block GB11 connected to the input port. However, unlike FIG. 10A, the first drive stage DS1 in FIG. 10B amplifies the first input signal and outputs an output signal based on the first input signal to a second load circuit (Load Circuit 2) connected to the first output port OUT1.

Referring to FIGS. 10C and 10D, shown are an example in which, when a second input signal is received, the first gain block GB11 of the first gain stage GS1 is disabled and the second gain block GB12 is enabled according to the first enable signal EN1 and the second gain stage GS2 is disabled according to the second enable signal EN2.

In FIG. 10C, when the second input signal IN2 is received, the first gain stage GS1 transmits the second input signal to the first drive stage DS1 through a gain block GB12 connected to the input port. The first drive stage DS1 amplifies the second input signal and outputs an output signal based on the second input signal to the first load circuit (Load Circuit 1) connected to the first output port OUT1.

In FIG. 10D, when the second input signal IN2 is received, the first gain stage GS1 transmits the second input signal to the first drive stage DS1 through the gain block GB12 connected to the input port. However, unlike FIG. 10C, the first drive stage DS1 in FIG. 10D amplifies the second input signal IN2 and outputs an output signal based on the second input signal to the second load circuit (Load Circuit 2) connected to the first output port OUT1.

That is, in the non-carrier aggregation mode, the LNA 100-2 may enable only the first amplifier stage AS1 connected to all input signal ports and all load circuits and keep the second amplifier stage AS2 in a disabled state, the second amplifier stage AS2 connected to the input port to which an intra-band carrier aggregation signal is applied.

FIG. 11 is a view illustrating a second operation mode of the LNA according to some example embodiments. According to some example embodiments, in the inter-band carrier aggregation mode (see FIG. 2A), signals are transmitted to both a first input port IN1 and a second input port IN2 as shown in FIG. 11, and the signals of the input ports are each amplified through different paths and transmitted to different load circuits.

Referring to FIG. 11, the first gain stage GS1 is enabled according to a first enable signal EN1 and the second gain stage GS2 is enabled according to a second enable signal EN2.

Specifically, referring to FIG. 11, the first input signal is applied to a gain block GB2 of the second gain stage GS2 through the first input port IN1 and the gain block GB2 transmits the first input signal to the first drive stage DS2. The second drive stage DS2 amplifies the transmitted first input signal and outputs the amplified first input signal to the second load circuit (Load Circuit 2). The second input signal is applied to the gain block GB12 of the first gain stage GS1 through the second input port IN2 and the gain block GB12 transmits the second input signal to the first drive stage DS1. The first drive stage DS1 amplifies the transmitted second input signal and outputs the amplified second input signal to the first load circuit (Load Circuit 1). In this case, the gain block GB11 is disabled.

FIG. 12 is a view illustrating a third operation mode of the LNA according to some example embodiments. According to some example embodiments, in the non-contiguous intra-band carrier aggregation mode (see FIG. 2C), a signal is input to only the first input port IN1 among the input signal terminals as shown in FIG. 12, and the gain stage and drive stage connected to the first input port IN1 are enabled.

Referring to FIG. 12, the first gain stage GS1 is enabled according to a first enable signal EN1 and the second gain stage GS2 is enabled according to a second enable signal EN2. The input signal is applied to the gain block GB11 of the first gain stage GS1 and the gain block GB2 of the second gain stage GS2 through the first input port IN1. The gain block GB11 transmits the input signal to the first drive stage DS1 and the gain block GB2 transmits the input signal to the second drive stage DS2. The drive stages DS1 and DS2 amplify the transmitted second input signal to output a first output signal OUT1 to the first load circuit and a second output signal OUT2 to the second load circuit, respectively. In this case, the gain block GB12 is disabled.

Figure 13:
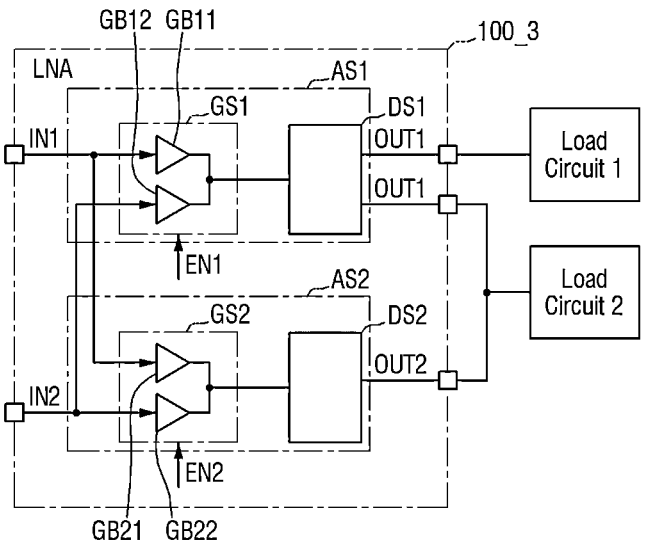
FIG. 13 is a block diagram illustrating an example of an LNA according to some example embodiments.
Figure 14:
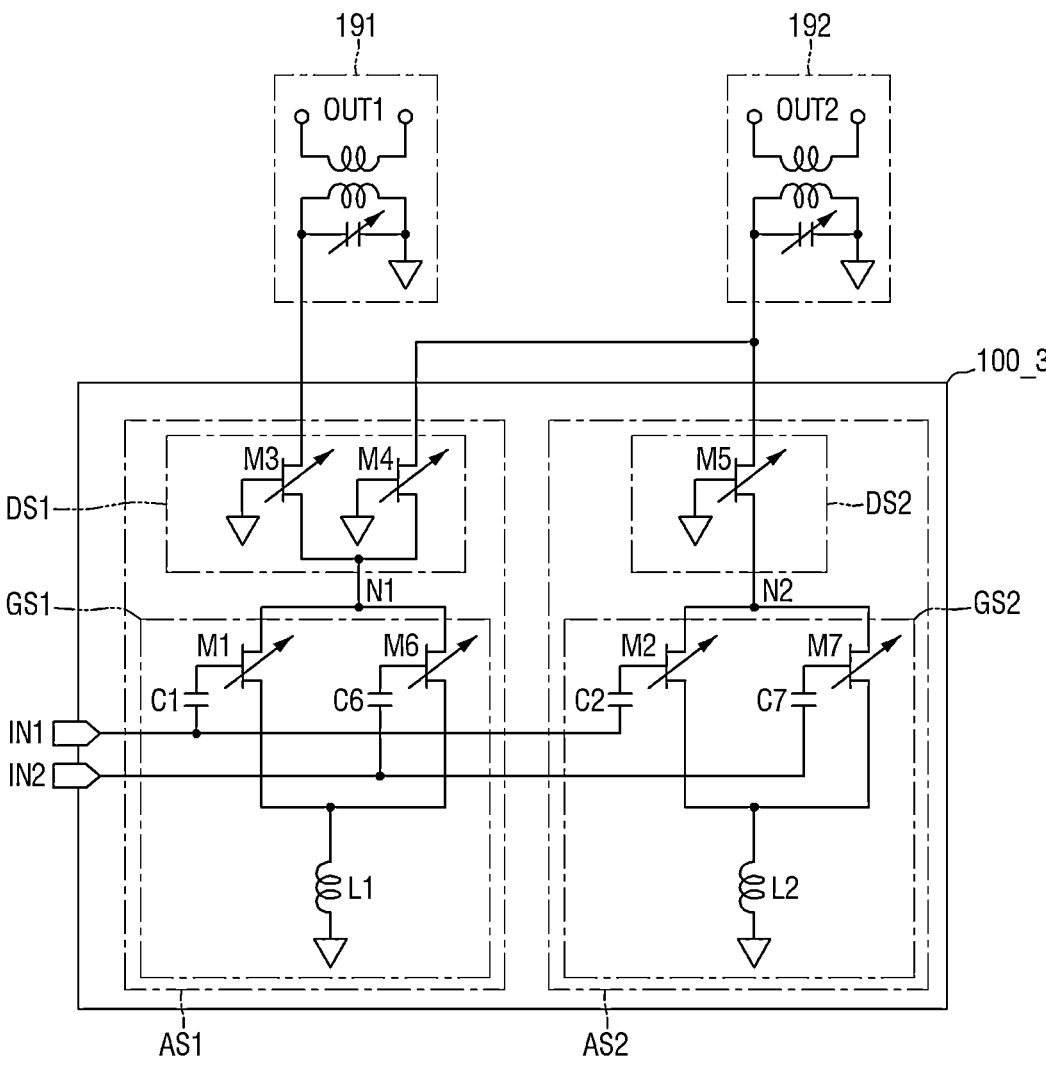
FIG. 14 is a circuit diagram illustrating an example embodiment of the LNA of FIG. 13.

FIG. 13 is a block diagram illustrating an example of an LNA according to some example embodiments, and FIG. 14 is a circuit diagram illustrating an example embodiment of the LNA of FIG. 13.

Referring to FIGS. 13 and 14, an LNA 100-3 according to some example embodiments may include two input ports IN1 and IN2, two gain stages GS1 and GS2, two drive stages DS1 and DS2, and two output ports OUT1 and OUT2. The LNA 100-3 may enable both the gain stages GS1 and GS2 based on enable signals EN1 and EN2.

A first amplifier stage AS1 includes the first gain stage GS1 and the first drive stage DS1, and a second amplifier stage AS2 includes the second gain stage GS2 and the second drive stage DS2.

The first gain stage GS1 includes a first gain block GB11 and a second gain block GB12 that are connected to the first input port IN1 and the second input port IN2, respectively. Outputs of the first gain block GB11 and the second gain block GB12 are respectively input to the first drive stage DS1 and the first drive stage DS1 drives the received outputs of the gain blocks to a first output port OUT1. The first output port OUT1 is connected to each of a first load circuit (Load Circuit 1) and a second load circuit (Load Circuit 2).

The second amplifier stage AS1 is connected between the first input port IN1 and a second output port OUT2. The second gain stage GS2 includes a third gain block GB21 and a fourth gain block GB22 that are connected to a first input port IN1 and a second input port IN2, respectively. Outputs of the third gain block GB21 and the fourth gain block GB22 are each input to the second drive stage DS2 and the second drive stage DS2 drives the received outputs of the gain blocks to a second output port OUT2. The second output port OUT2 is connected to the second load circuit (Load Circuit 2).

The first gain stage GS1 may include input capacitors C1 and C6, input transistors M1 and M6, and a degeneration inductor L1, and the first drive stage DS1 may include cascode transistors M3 and M4. The input capacitor C1 is connected between the first input port IN1 and a gate of the input transistor M2 and the input capacitor C6 is connected between the second input port IN2 and a gate of the input transistor M6. The degeneration inductor L1 may be connected between a source terminal and a ground terminal of the input transistors M1 and M6. The cascode transistor M3 may be connected between a common drain terminal (e.g., a first node N1) of the input transistors M1 and M6 and a first output port OUT1-191 connected to a first load circuit 191. The cascode transistor M4 may be connected between the first node N1 and a first output port OUT1-192 connected to a second load circuit 192. According to some example embodiments, a desired (or, alternatively predetermined) bias may be applied to a gate terminal of each of the cascode transistors M3, M4, and M5 shown in FIG. 14.

The first amplifier stage AS1 may adjust a ratio of the first input signal IN1 to the first output signal OUT1-191 or a ratio of the second input signal IN2 to the first output signal OUT1-191 according to the varying of the cascode transistor M3. Also, the first amplifier stage AS1 may adjust a ratio of the first input signal IN1 to the first output signal OUT1-192 or a ratio of the second input signal IN2 to the first output signal OUT1-192 according to the varying of the cascode transistor M4.

The second gain stage GS2 may include input capacitors C2 and C7, input transistors M2 and M7, and a degeneration inductor L2, and the second drive stage DS2 may include a cascode transistor M5. The input capacitor C2 is connected between the first input port IN1 and a gate of the input transistor M2 and the input capacitor C7 is connected between the second input port IN2 and a gate of the input transistor M7. The degeneration inductor L2 may be connected between a source terminal and a ground terminal of the input transistor M2. The cascode transistor M5 may be connected between a common drain terminal N2 of the input transistors M2 and M7 and a second output port OUT2 connected to the second load circuit 192.

The cascode transistor M5 may adjust a gain of the second amplifier stage AS2 by providing a bias to the input transistors M2 and M7 and simultaneously or substantially simultaneously varying the cascode transistor M5. That is, the second amplifier stage AS2 may adjust a ratio of the first input signal IN1 to the second output signal OUT2-192 or a ratio of the second input signal IN2 to the second output signal OUT2-192 according to the varying of the cascode transistor M5.

According to some example embodiments, the cascode transistors M3, M4, and M5 shown in FIG. 14 may be independently varied to independently control the gains of the first amplifier stage AS1 and the second amplifier stage AS2.

Load circuits 191 and 192 may each be connected to the LNA 100-3. The first amplifier stage AS1 may be connected to the first load circuit 191 and the second load circuit 192 to transmit the first output signal, and the second amplifier stage AS2 may be connected to the second load circuit 192 to transmit the second output signal.

That is, in the LNA 100-3 according to some example embodiments, the first input port IN1 and the second input port IN2 support carrier aggregation including the non-contiguous intra-band carrier aggregation. That is, the first gain stage GS1 may be connected to all load circuits in order to support the non-carrier aggregation and the inter-band carrier aggregation, select a switch according to the first input signal or second input signal received from the input port, and output an output signal to a selected load circuit. Also, in order to support the non-contiguous intra-band carrier aggregation, the first gain stage GS1 may select the first load circuit and output an output signal to the selected first load circuit. The second gain stage GS2 may be connected to all input ports in order to support the non-contiguous intra-band carrier aggregation, and may amplify the first input signal or second input signal received from the input port and transmit the amplified input signal to the second load circuit.

Figure 16A:
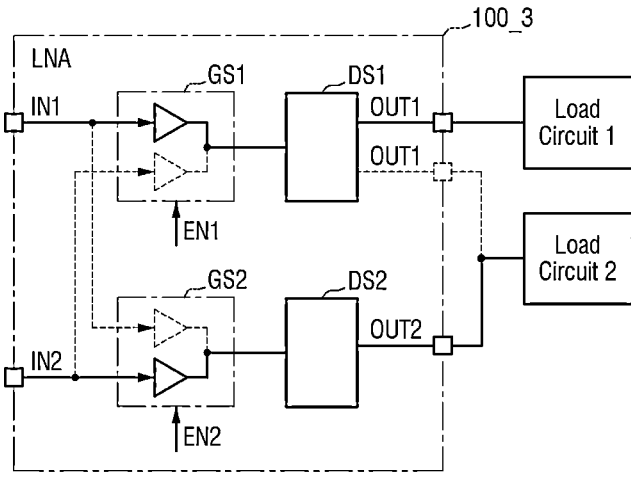
FIGS. 16A and 16B are views illustrating a second operation mode of an LNA according to some example embodiments.
Figure 16B:
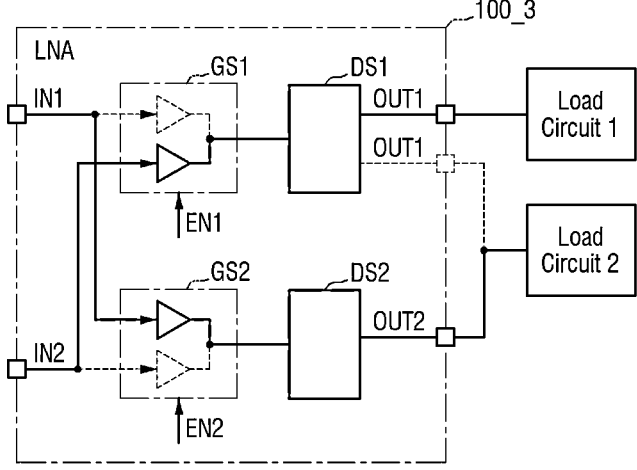
Figure 17A:
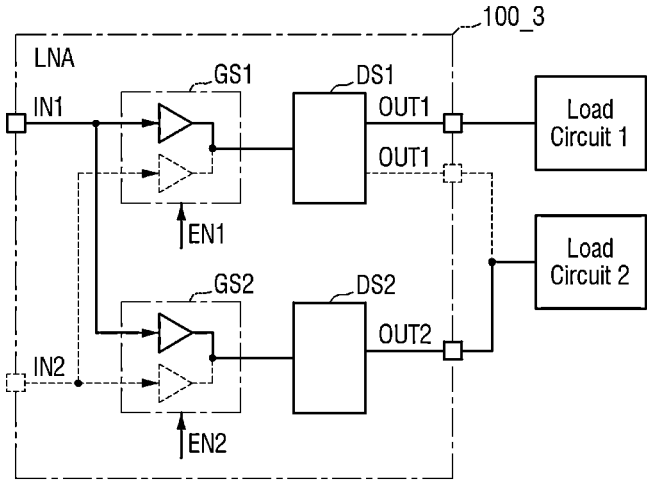
FIGS. 17A and 17B are views illustrating a third operation mode of the LNA according to some example embodiments.
Figure 17B:
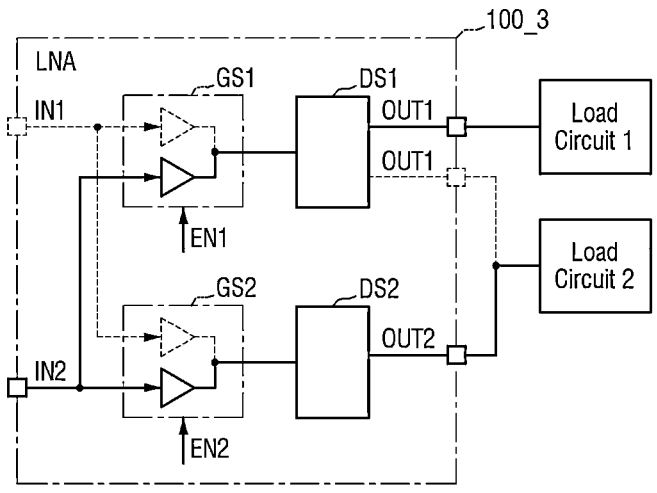

FIGS. 15A to 15D are views of an LNA 100-3 having the same structure, illustrating an operation state of the LNA according to an operation mode, wherein elements and lines that are enabled in relation to the amplification of an input signal are denoted by solid lines and disabled elements and lines are denoted by dotted lines. FIGS. 15A to 15D illustrate an operation mode in non-carrier aggregation. FIGS. 16A to 16B illustrate an operation mode in inter-band carrier aggregation. FIGS. 17A to 17B illustrate an operation mode in non-continuous intra-band carrier aggregation.

FIGS. 15A to 15D are views illustrating a first operation mode of an LNA according to some example embodiments.

Figure 15A:
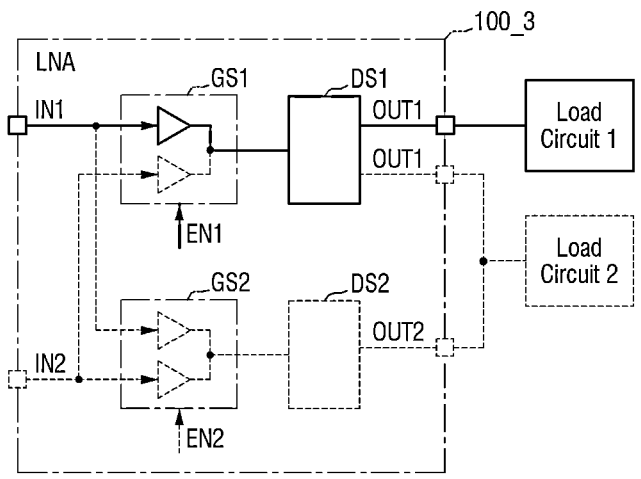
FIGS. 15A, 15B, 15C and 15D illustrate an operation mode in non-carrier aggregation.

Referring to FIG. 15A, shown is an example in which, when an input signal is received on the first input port IN1, the gain block GB11 of the first gain stage GS1 of the LNA 100-3 is enabled and the gain block GB12 is disabled according to a first enable signal EN1 and the second gain stage GS2 is disabled according to a second enable signal EN2. When the first input signal is received on the first input port IN1, the first gain stage GS1 transmits the first input signal to the first drive stage DS1 through the gain block GB11 connected to the input port. The first drive stage DS1 amplifies the first input signal according to a bias and outputs a first output signal OUT1 based on the first input signal to a first load circuit (Load Circuit 1) connected to the first output port.

Figure 15B:
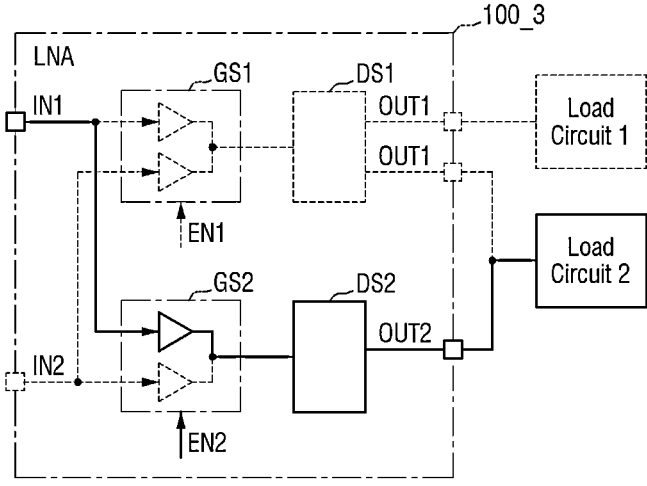

Referring to FIG. 15B, shown is an example in which, when the first input signal is received, the first gain stage GS1 is disabled according to the first enable signal EN1 and the gain block GB21 of the second gain stage GS2 is enabled and the gain block GB22 of the second gain stage GS2 is disabled according to the second enable signal EN2. When the first input signal is received on the first input port IN1, the second gain stage GS2 transmits the first input signal to the second drive stage DS2 through the gain block GB21 of the second gain stage GS2. The second drive stage DS2 amplifies the first input signal according to a bias and outputs a second output signal OUT2 based on the first input signal to a second load circuit (Load Circuit 2) connected to the second output port.

Figure 15C:
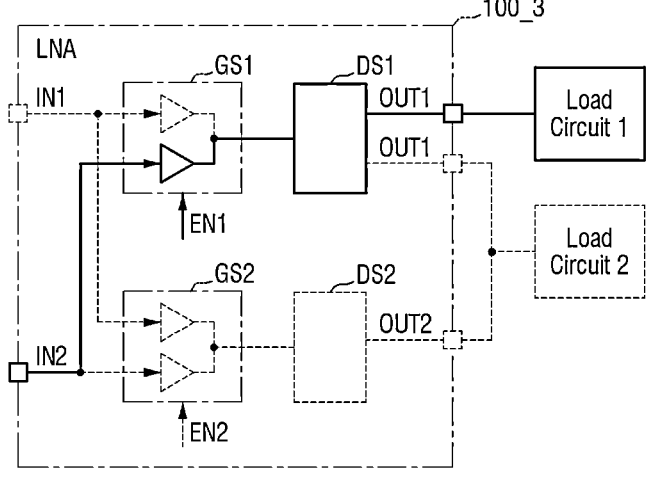

Referring to FIG. 15C, shown is an example in which, when an input signal is received on the second input port IN2, the gain block GB11 of the first gain stage GS1 is disabled and the gain block GB12 is enabled according to the first enable signal EN1 and the second gain stage GS2 is disabled according to the second enable signal EN2. When the second input signal is received on the second input port IN2, the first gain stage GS1 transmits the second input signal to the first drive stage DS1 through the gain block GB12 connected to the input port. The first drive stage DS1 amplifies the second input signal according to a bias and outputs a first output signal OUT1 based on the second input signal to the first load circuit (Load Circuit 1) connected to the first output port.

Figure 15D:
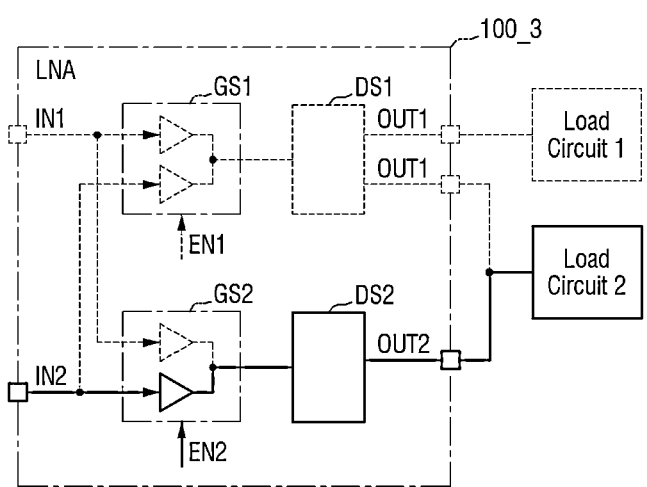

Referring to FIG. 15D, shown is an example in which, when an input signal is received on the second input port IN2, the first gain stage GS1 is disabled according to the first enable signal EN1 and the gain block GB21 of the second gain stage GS2 is disabled and the gain block GB22 of the second gain stage GS2 is enabled according to the second enable signal EN2. When the second input signal IN2 is received, the second gain stage GS2 transmits the second input signal to the second drive stage DS2 through the gain block GB22. The second drive stage DS2 amplifies the second input signal according to a bias and outputs a second output signal OUT2 based on the second input signal to the second load circuit (Load Circuit 2) connected to the second output port.

FIGS. 16A and 16B are views illustrating a second operation mode of an LNA according to some example embodiments. According to some example embodiments, in the inter-band carrier aggregation mode (see FIG. 2B), signals are transmitted to both the first input port IN1 and the second input port IN2 as shown in FIGS. 16A and 16B, and the signals of the input ports are each amplified through different paths and transmitted to different load circuits.

Referring to FIGS. 16A and 16B, the first gain stage GS1 is enabled according to a first enable signal EN1 and the second gain stage GS2 is enabled according to a second enable signal EN2. However, in the LNA 100-3 of FIG. 16A, the first and second gain stages GS1 and GS2 enable different gain blocks, unlike in the LNA 100-3 of FIG. 16B.

Specifically, referring to FIG. 16A, a first input signal is applied to the gain block GB11 of the first gain stage GS1 through the first input port IN1 and the gain block GB11 transmits the first input signal to the first drive stage DS1. The first drive stage DS1 amplifies the transmitted first input signal and outputs the amplified first input signal to the first load circuit (Load Circuit 1). The second input signal is applied to the gain block GB22 of the second gain stage GS2 through the second input port IN2 and the gain block GB22 transmits the second input signal to the second drive stage DS2. The second drive stage DS2 amplifies the transmitted second input signal and outputs the amplified second input signal to the second load circuit (Load Circuit 2). In this case, the gain blocks GB12 and GB21 are disabled.

Referring to FIG. 16B, the first input signal is applied to the gain block GB21 of the second gain stage GS2 through the first input port IN1 and the gain block GB21 transmits the first input signal to the second drive stage DS2. The second drive stage DS2 amplifies the transmitted first input signal and outputs the amplified first input signal to the second load circuit (Load Circuit 2). The second input signal is applied to the gain block GB12 of the first gain stage GS1 through the second input port IN2 and the gain block GB12 transmits the second input signal to the first drive stage DS1. The first drive stage DS1 amplifies the transmitted second input signal and outputs the amplified second input signal to the first load circuit (Load Circuit 1). In this case, the gain blocks GB11 and GB22 are disabled.

FIGS. 17A to 17B are views illustrating a third operation mode of the LNA according to some example embodiments. According to some example embodiments, in the non-contiguous intra-band carrier aggregation mode (see FIG. 2C), a signal is input to only one of the input ports IN1 or IN2 among the input signal terminals as shown in FIGS. 17A and 17B, the gain block of the gain stage connected to the input port IN1 or IN2 to which the signal is input is enabled, and an amplified signal is transmitted to all load circuits. For example, FIG. 17A illustrates a state in which the first input port IN1 is enabled and the second input port IN2 is disabled, and FIG. 17B illustrates a state in which the first input port IN1 is disabled and the second input port IN2 is enabled.

Specifically, referring to FIG. 17A, the first input signal is applied to the gain block GB11 of the first gain stage GS1 and the gain block GB21 of the second gain stage GS2 through the first input port IN1. The gain block GB11 transmits the input signal to the first drive stage DS1 and the gain block GB21 transmits the input signal to the second drive stage DS2. The drive stages DS1 and DS2 amplify the transmitted second input signal to output a first output signal OUT1 to the first load circuit and a second output signal OUT2 to the second load circuit, respectively. In this case, the gain blocks GB12 and GB22 connected to the second input port IN2 are disabled.

Referring to FIG. 17B, the input signal is applied to the gain block GB12 of the first gain stage GS1 and the gain block GB22 of the second gain stage GS2 through the second input port IN2. The gain block GB12 transmits the input signal to the first drive stage DS1 and the gain block GB22 transmits the input signal to the second drive stage DS2. The drive stages DS1 and DS2 amplify the transmitted second input signal to output a first output signal OUT1 to the first load circuit and a second output signal OUT2 to the second load circuit, respectively. In this case, the gain blocks GB11 and GB12 connected to the first input port IN1 are disabled.

Figure 18:
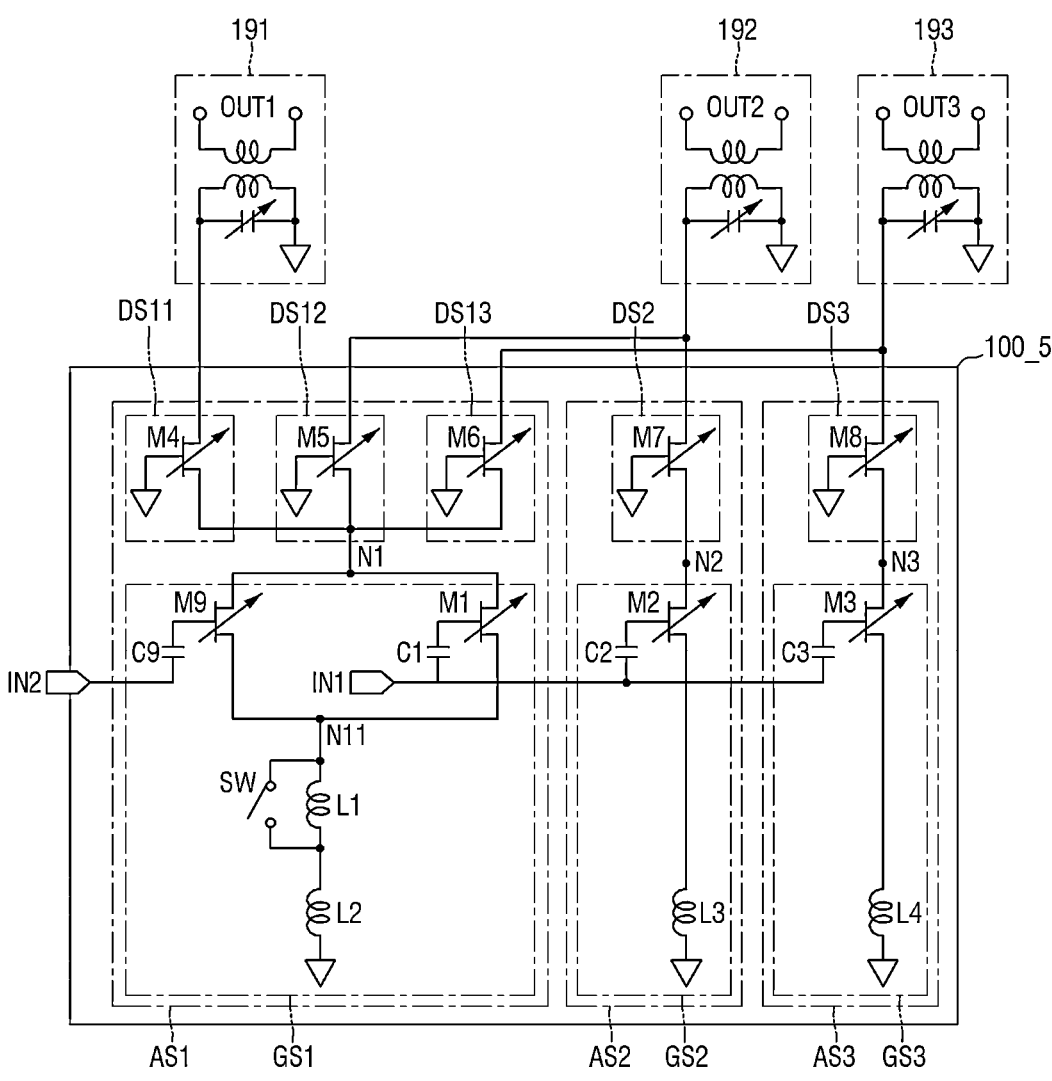
FIG. 18 is a block diagram illustrating an example of an LNA according to some example embodiments.

FIG. 18 is a block diagram illustrating an example of an LNA according to some example embodiments. According to some example embodiments, FIG. 18 illustrates an LNA in which three amplifier stages AS1, AS2, and AS3 are included and input signals received on two input ports IN1 and IN2 are transmitted to three load circuits respectively connected to the three amplifier stages.

Referring to FIG. 18, an LNA 100-5 according to some example embodiments may include two input ports IN1 and IN2, three gain stages GS1, GS2, and GS3, three drive stages DS1, DS2, and DS3, and three output ports OUT1, OUT2, and OUT3. The first amplifier stage AS1 includes a first gain stage GS1, a first-first drive stage DS11, a first-second drive stage DS12, a first-third drive stage DS13, the second amplifier stage AS2 includes the second gain stage GS2 and the second drive stage DS2, and the third amplifier stage AS3 includes the third gain stage GS3 and the third drive stage DS3.

The first gain stage GS1 includes a gain block GB11 connected to the first input port IN1, a gain block GB12 connected to the second input port IN2, and degeneration inductors L1 and L2. An output of the gain block GB11 is input to a common input terminal (node N1) of the first-first to first-third drive stages DS11, DS12, and DS13, and each drive stage DS1 drives the output of the gain block, which is received on the node N1, to output it to the first to third output ports OUT1, OUT2, and OUT3. An output of the gain block GB12 is input to the common input terminal (node N1) of the first-first to first-third drive stages DS11, DS12, and DS13, and each drive stage DS1 drives the output of the gain block, which is received on the node N1, to output it to the first to third output ports OUT1, OUT2, and OUT3. The first output port OUT1, the second output port OUT2, and the third output port OUT3 are connected to a first load circuit (Load Circuit 1), a second load circuit (Load Circuit 2), and a third load circuit, respectively.

The gain block GB11 includes an input capacitor C1 and an input transistor M1. The input capacitor C1 is connected between the first input port IN1 and a gate of the input transistor M1 and the input transistor M1 is connected to node N11 (a first common node of the gain blocks GB11 and GB12) and the node N1 (a second common node of the gain blocks GB11 and GB12). The gain block GB12 includes an input capacitor C9 and an input transistor M9. The input capacitor C9 is connected between the second input port IN2 and a gate of the input transistor M9 and the input transistor M9 is connected between the node N11 and the node N1.

The degeneration inductor L1 and the degeneration inductor L2 are connected in series between the node N11 and a ground terminal. The degeneration inductor L1 may further include a switch SW connected to both ends, and the degeneration inductor L1 may be bypassed when the switch SW is turned on.

The LNA 100-5 of FIG. 18 amplifies an input signal received on the input port IN1 or IN2 which is enabled according to an operation mode and transmits the amplified input signal to each of the load circuits 191, 192, and 193.

According to some example embodiments, in the non-carrier aggregation mode, the first amplifier stage AS1 of the LNA 100-5 operates and the second amplifier stage AS2 and the third amplifier stage AS3 are disabled. In the LNA 100-5, the input transistor M1 or the input transistor M9 is turned on according to the input port IN1 or IN2 that is enabled in the first amplifier stage AS1, and one of the drive stages DS11 to DS13 connected to the turned-on input transistor is enabled to transmit an amplified input signal to one of the load circuits 191 to 193. According to some example embodiments, the switch SW is turned off so that a current may be applied to the degeneration inductor L1.

According to some example embodiments, in the inter-band carrier aggregation mode for two load circuits, the two input ports of the LNA 100-5 are all enabled and two amplifier stages connected to the respective input ports among the three amplifier stages are simultaneously or substantially simultaneously enabled and the other amplifier stage is disabled. For example, the first amplifier stage AS1 is enabled all the time and the second amplifier stage AS1 or the third amplifier stage AS3 is selectively disabled. According to some example embodiments, the switch SW may be turned on so that the degeneration inductor L1 may be bypassed for gain compensation.

According to some example embodiments, in the non-contiguous intra-band carrier aggregation mode for three load circuits, one of the two input ports of the LNA 100-5 is selectively enabled and two or more of the three amplifier stages are simultaneously or substantially simultaneously enabled. According to some example embodiments, the switch SW may be turned on so that the degeneration inductor L1 may be bypassed for gain compensation. For example, when the first input port IN1 is enabled, two or more of the input transistors M1, M2, and M3 connected to the first input port may be turned on, and each of the turned-on input transistors amplifies the input signal and transmits the amplified input signal to two or more of the first to third load circuits 191 to 193.

Figure 19:
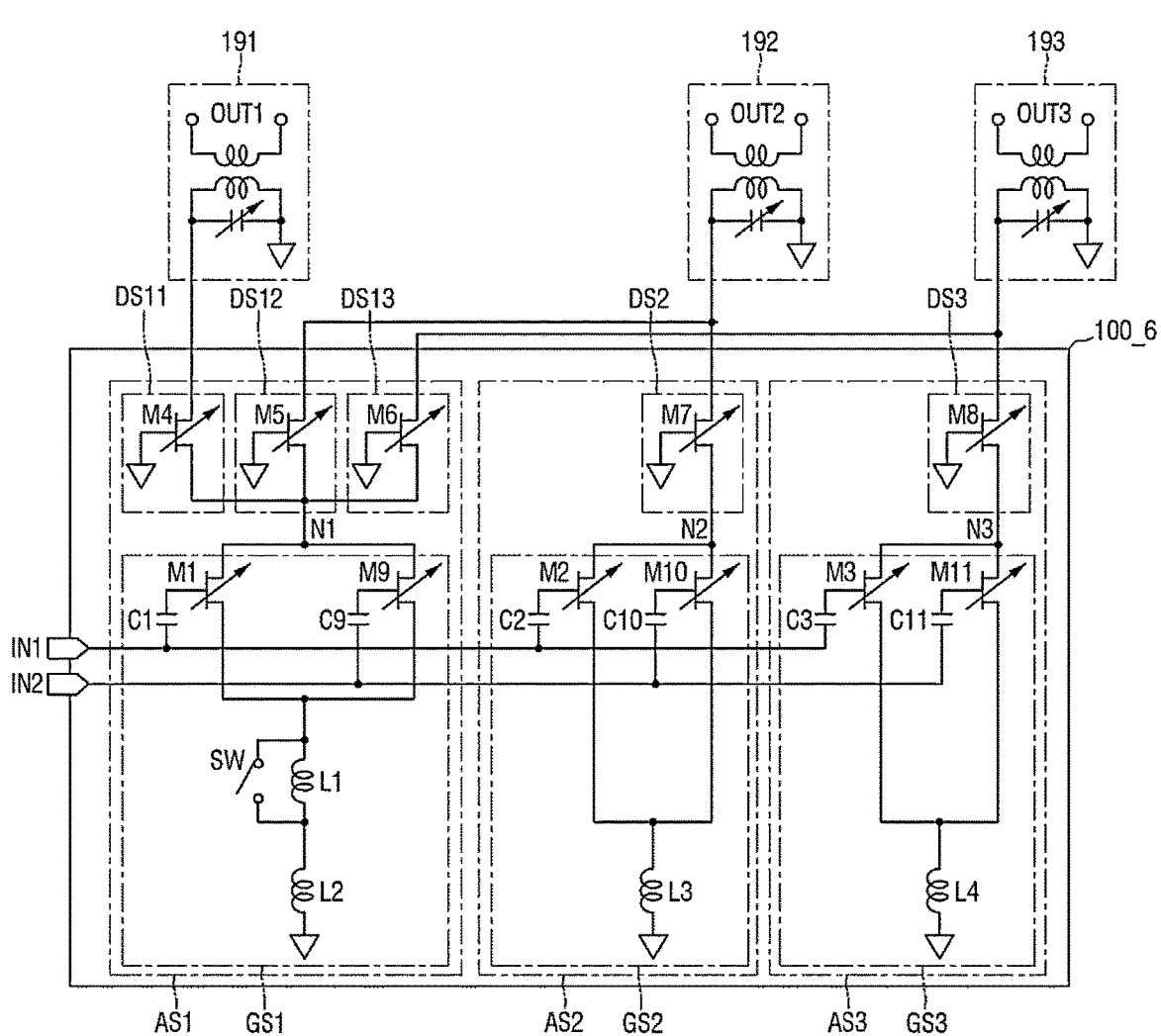
FIG. 19 is a block diagram illustrating an example of an LNA according to some example embodiments.

FIG. 19 is a block diagram illustrating an example of an LNA according to some example embodiments. According to some example embodiments, FIG. 19 illustrates an LNA in which three amplifier stages AS1, AS2, and AS3 are included and input signals received on two input ports IN1 and IN2 are transmitted to three load circuits respectively connected to the three amplifier stages. For simplicity, description redundant to FIG. 18 will be omitted.

Referring to FIG. 19, an LNA 100-6 according to some example embodiments may include two input ports IN1 and IN2, three gain stages GS1, GS2, and GS3, three drive stages DS1, DS2, and DS3, and three output ports OUT1, OUT2, and OUT3. Unlike FIG. 18, the two input ports IN1 and IN2 are connected to each of the gain stages GS1, GS2, and GS3 of the respective first to third amplifier stages AS1, AS2, and AS3.

The first gain stage GS1 includes a gain block GB11 connected to the first input port IN1, a gain block GB12 connected to the second input port IN2, and degeneration inductors L1 and L2. An output of the gain block GB11 is input to a common input terminal (node N1) of the first-first to first-third drive stages DS11, DS12, and DS13, and each drive stage DS1 drives the output of the gain block, which is received on the node N1, to output it to the first to third output ports OUT1, OUT2, and OUT3. An output of the gain block GB12 is input to the common input terminal (node N1) of the first-first to first-third drive stages DS11, DS12, and DS13, and each drive stage DS1 drives the output of the gain block, which is received on the node N1, to output it to the first to third output ports OUT1, OUT2, and OUT3. The first output port OUT1, the second output port OUT2, and the third output port OUT3 are connected to a first load circuit (Load Circuit 1), a second load circuit (Load Circuit 2), and a third load circuit, respectively.

The gain block GB11 includes an input capacitor C1 and an input transistor M1. The input capacitor C1 is connected between the first input port IN1 and a gate of the input transistor M1, and the input transistor M1 is connected to one end of the degeneration inductor L1 and node N1 (a common node of the gain blocks GB11 and GB12). The gain block GB12 includes an input capacitor C9 and an input transistor M9. The input capacitor C9 is connected between the second input port IN2 and a gate of the input transistor M9, and the input transistor M9 is connected between one end of the degeneration inductor L1 and the node N1.

The second gain stage GS2 includes a gain block GB21 connected to the first input port IN1, a gain block GB22 connected to the second input port IN2, and a degeneration inductor L3. The gain block GB21 includes an input capacitor C2 and an input transistor M2. The input capacitor C2 is connected between the first input port IN1 and a gate of the input transistor M2, and the input transistor M2 is connected to one end of the degeneration inductor L1 and node N2 (a common node of the gain blocks GB21 and GB22). The gain block GB22 includes an input capacitor C10 and an input transistor M10. The input capacitor C10 is connected between the second input port IN2 and a gate of the input transistor M10, and the input transistor M10 is connected between one end of the degeneration inductor L3 and the node N2.

The third gain stage GS3 includes a gain block GB31 connected to the first input port IN1, a gain block GB32 connected to the second input port IN2, and a degeneration inductor L4. The gain block GB31 includes an input capacitor C3 and an input transistor M3. The input capacitor C3 is connected between the first input port IN1 and a gate of the input transistor M3, and the input transistor M3 is connected to one end of the degeneration inductor L4 and node N3 (a common node of the gain blocks GB31 and GB32). The gain block GB32 includes an input capacitor C11 and an input transistor M11. The input capacitor C11 is connected between the second input port IN2 and a gate of the input transistor M11, and the input transistor M11 is connected between one end of the degeneration inductor L4 and the node N3. A transistor M8 may be connected between the node N3 and the third load circuit 193.

According to some example embodiments, in the non-carrier aggregation mode, the first amplifier stage AS1 of the LNA 100-6 operates and the second amplifier stage AS2 and the third amplifier stage AS3 are disabled.

According to some example embodiments, in the inter-band carrier aggregation mode for two load circuits, the two input ports of the LNA 100-6 are all enabled and two amplifier stages connected to the respective input ports among the three amplifier stages are simultaneously or substantially simultaneously enabled and the other amplifier stage is disabled. For example, one of the first amplifier stage ASI, the second amplifier stage AS2, and the third amplifier stage AS3 connected to the respective load circuits is selectively disabled. According to some example embodiments, the switch SW may be turned on so that the degeneration inductor LI may be bypassed for gain compensation. Unlike FIG. 18, at least one of the input transistors M1, M2, and M3 connected to the first input port INI may be turned on, and the input transistors M9, MIO, and M11 connected to the second input port IN2 may be selected in one of the amplifier stages other than the amplifier stage having the turned-on input transistor M1, M2, or M3, and be turned on. For example, when the input transistor M1 is turned on with respect to the first input port, one of the input transistors in the amplifier stages AS2 and AS3, other than the input transistor M9 of the amplifier stage AS 1 to which the input transistor M1 belongs, e.g., the input transistor M10 or the input transistor M11, may be turned on with respect to the second input port to form a current path.

According to some example embodiments, in the intra-band carrier aggregation mode for three load circuits, the LNA 100-6 selectively enables one of the two input ports and enables two or more of the three amplifier stages simultaneously or substantially simultaneously. For example, when the first input port IN1 is enabled, two or more of the input transistors M1, M2, and M3 connected to the first input port are turned on, and each of the turned-on input transistors amplifies the input signal and transmits the amplified input signal to two or more of the first to third load circuits 191 to 193. When the second input port IN2 is enabled, the second input port IN2, two or more of the input transistors M9, M10, and M11 connected to the second input port IN2 are turned on and each of the turned-on input transistors amplifies the input signal and transmits the amplified input signal to two or more of the first to third load circuits 191 to 193.

FIG. 20 is a view illustrating an example of a receiver including an LNA according to some example embodiments. As described above with reference to FIG. 1, LNAs 100 of FIG. 20 may provide output signals OUTs through a plurality of lines by amplifying input signals INs through a plurality of lines, and load circuits 14 may provide a receiver output signal RX_OUT from the plurality of output signals OUTs.

Referring to FIG. 20, the LNAs 100 may include k LNAs LNA1 to LNAk (k is an integer greater than 1). The k LNAs LNA1 to LNAk may receive k input signals IN1 to INk, respectively. In the example of FIG. 20, each of the k LNAs LNA1 to LNAk may have a similar structure to that of the LNAs 100-5 and 100-6 of FIGS. 19 to 20, in which three output signals are provided from one input signal. As illustrated in FIG. 20, outputs of the k LNAs LNA1 to LNAk may be connected to each other.

The load circuits 14 may include baluns 210, mixers 220, filters 230, and buffers 240 as illustrated in FIG. 20. The baluns 210 may convert one phase output signal provided from the LNAs 100 into a differential phase signal, and provide the differential signal to the mixers 220. For example, as illustrated in FIG. 20, the baluns 210 may include transformers, and each of the transformers may include a primary coil to which one phase signal is applied and a secondary coil which outputs a differential phase signal.

The mixers 220 may down-convert differential signals provided from the baluns 210. For example, the mixers 220 may receive vibration signals LO1 to LO3 corresponding to frequencies of carrier signals, and may move the differential signals provided from the baluns 210 to a baseband based on the vibration signals LO1 to LO3. The filters 230 may remove unnecessary frequency components by filtering the signals moved to the baseband.

The buffers 240 may provide the receiver output signal RX_OUT by amplifying the filtered signals to a desired (or, alternatively predetermined) gain. As described above, each of the k LNAs may operate differently according to an operation mode, and may be designed to reduce variations of an input impedance according to the operation mode. A ratio of the input signals INs to the receiver output signal RX_OUT, that is, an overall gain, may be changed in each of operation modes, and the buffers 240 may compensate for variations of overall gain per such an operation mode. That is, a gain of the buffer included in the buffers 240 may be varied based on the mode signal MD provided from the controller 300 of FIG. 1. For example, each of the buffers included in the buffers 240 may include a variable resistor, and the gain of the buffer may be changed by changing a resistance of the variable resistor based on the mode signal MD. Accordingly, even though the operation mode of the LNA, that is, the setting of the carriers is changed, the receiver output signal RX_OUT may have a constant or substantially constant magnitude.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

One or more of the elements disclosed above may include or be implemented in one or more processing circuitries such as hardware including logic circuits; a hardware/software combination such sa a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

Although some example embodiments have been described with reference to the accompanying drawings, various modifications and alterations may be made without departing from the inventive concepts. Therefore, it should be understood that the above-mentioned example embodiments are not restrictive.

What is claimed:

1. A low noise amplifier comprising:
a first input port configured to receive a first input signal;
a second input port configured to receive a second input signal;
a first amplifier stage including a first gain stage connected to the first input port and the second input port, and a first drive stage connected between the first gain stage and a first load circuit, wherein the first gain stage includes a first-first gain block connected to the first input port, a first-second gain block connected to the second input port, and a first degeneration inductor connected between a ground terminal and a common node of the first-first gain block and the first-second gain block; and a second amplifier stage including a second gain stage connected to the first input port and the second input port, and a second drive stage connected between the second gain stage and a second load circuit, wherein the first-first gain block comprises a first input transistor and the first-second gain block comprises a second input transistor, wherein the first drive stage comprises a first variable cascode transistor connected to a first common node and the first load circuit, and wherein the first variable cascode transistor is a single variable cascode transistor configured to (i) receive a combined output, via the first common node, from the first-first gain block and the first-second gain block and (ii) adjust a gain of the first amplifier stage based on providing a bias voltage to the first input transistor and the second input transistor.

2. The low noise amplifier of claim 1, wherein the low noise amplifier is configured to, in a non-carrier aggregation mode, selectively enable the first input port and the second input port, amplify an input signal received on the enabled input port, and transmit the amplified input signal to one of the first load circuit and the second load circuit.

3. The low noise amplifier of claim 1, wherein the low noise amplifier is configured to, in an inter-band carrier aggregation mode, enable both the first input port and the second input port, amplify the first input signal and the second input signal through current paths of different amplifier stages, and transmit the amplified input signals to the first load circuit or the second load circuit.

4. The low noise amplifier of claim 1, wherein the low noise amplifier is configured to, in a non-contiguous carrier aggregation mode, selectively enable the first input port and the second input port, amplify an input signal received on one of the enabled input ports, and transmit the amplified input signal to the first load circuit and the second load circuit.

5. The low noise amplifier of claim 1, wherein the first-first gain block comprises (i) the first input transistor connected between the first common node and one end of the first degeneration inductor and (ii) a first input capacitor connected between a gate of the first input transistor and the first input port, and the first-second gain block comprises (i) the second input transistor connected between the first common node and the one end of the first degeneration inductor and (ii) a second input capacitor connected between a gate of the second input transistor and the second input port.

6. The low noise amplifier of claim 5, wherein the second drive stage comprises a second variable cascode transistor connected to the second load circuit.

7. The low noise amplifier of claim 1, wherein the second gain stage comprises a second degeneration inductor having a first end connected to the ground terminal, a second-first gain block including a third input transistor connected between a second end of the second degeneration inductor and an input of the second drive stage, and a third input capacitor connected between a gate of the third input transistor and the first input port, and a second-second gain block including a fourth input transistor connected between the second end of the second degeneration inductor and the input of the second drive stage, and a fourth input capacitor connected between a gate of the fourth input transistor and the second input port.

8. The low noise amplifier of claim 7, wherein a size of the first degeneration inductor is larger than a size of the second degeneration inductor.

9. The low noise amplifier of claim 1, wherein an output of the first drive stage is connected to the second load circuit.

10. The low noise amplifier of claim 9, wherein the second gain stage comprises a second degeneration inductor having a first end connected to the ground terminal, a third input transistor connected between a second end of the second degeneration inductor and an input of the second drive stage, and a second gain block including a third input capacitor connected between a gate of the third input transistor and the first input port.

11. A low noise amplifier comprising:

a first amplifier stage including a first drive stage and a first gain stage, the first gain stage including a first-first gain block connected to a first input port and a first-second gain block connected to a second input port, the first drive stage being connected to a first load circuit and a second load circuit, the first drive stage being configured to receive an amplified first input signal from the first gain stage and transmit the received input signal to at least one of the first load circuit and the second load circuit; and a second amplifier stage including a second gain stage comprising a second gain block connected to the first input port and a second drive stage connected between the second gain stage and a second load circuit, wherein the low noise amplifier is configured to operate in a non-carrier aggregation mode, an inter-band carrier aggregation mode, or a non-contiguous intra-band carrier aggregation mode.

12. The low noise amplifier of claim 11, wherein in the non-carrier aggregation mode, based on the first input port being enabled, the low noise amplifier is configured to transmit the first input signal, which is amplified in the first-first gain block, to the first load circuit or the second load circuit from the first drive stage, and based on the second input port being enabled, the low noise amplifier is configured to transmit a second input signal, which is amplified in the first-second gain block, to the first load circuit or the second load circuit from the first drive stage.

13. The low noise amplifier of claim 11, wherein in the inter-band carrier aggregation mode, the low noise amplifier is configured to amplify a first input signal of the first input port at the second gain block to transmit the amplified first input signal to the second load circuit through the second drive stage, and amplify a second input signal of the second input port at the first-second gain block to transmit the amplified second input signal to the first load circuit through the first drive stage.

14. The low noise amplifier of claim 11, wherein in the non-contiguous intra-band carrier aggregation mode, the low noise amplifier is configured to amplify a first input signal of the first input port at the first-first gain block to transmit the amplified first input signal to the first load circuit through the first drive stage, and amplify the first input signal at the second gain block to transmit the amplified first input signal to the second load circuit through the second drive stage.

15. A low noise amplifier comprising:
a first load circuit, a second load circuit, and a third load circuit;
a first amplifier stage including a first gain stage configured to amplify a first input signal of a first input port or a second input signal of a second input port, a first-first drive stage configured to transmit an output of the first gain stage to the first load circuit, a first-second drive stage configured to transmit the output of the first gain stage to the second load circuit, and a first-third drive stage configured to transmit the output of the first gain stage to the third load circuit;
a second amplifier stage including a second gain stage configured to amplify the second input signal of the second input port, and a second drive stage configured to transmit an output of the second gain stage to the second load circuit; and
a third amplifier stage including a third gain stage configured to amplify the second input signal of the second input port, and a third drive stage configured to transmit an output of the third gain stage to the third load circuit,
wherein in a non-contiguous intra-band carrier aggregation mode, based on the first input port or the second input port being enabled, at least two or more of the first to third amplifier stages are simultaneously enabled, and
wherein in a non-carrier aggregation mode, the low noise amplifier is configured to transmit the first input signal, which is amplified in the first gain stage, to each of the first to third load circuits by selecting one of the first-first to first-third drive stages.

16. The low noise amplifier of claim 15, wherein a size of a first degeneration inductor (L2) of the first gain stage is different from a size of a second degeneration inductor (L3) of the second gain stage and a size of a third degeneration inductor (L4) of the third gain stage.

17. The low noise amplifier of claim 16, wherein the first gain stage further comprises,
a fourth degeneration inductor connected in series with the first degeneration inductor, and
a switch connected to both ends of the fourth degeneration inductor and configured to turn on based on the low noise amplifier operating in an intra-band carrier aggregation mode.

18. The low noise amplifier of claim 15, wherein in an inter-band carrier aggregation mode, the low noise amplifier is configured to amplify the first input signal through current paths of the first to third amplifier stages to transmit the amplified first input signal to the first to third load circuits.

\* \* \* \* \*